United States Patent [19]
Sasaki et al.

[11] Patent Number: 5,691,952
[45] Date of Patent: Nov. 25, 1997

[54] SEMICONDUCTOR MEMORY DEVICE AND MEMORY MODULE USING THE SAME

[75] Inventors: Toshio Sasaki, Mizuho-machi; Kazumasa Yanagisawa, Kokubunji; Toshio Sugano, Kodaira; Kiyoshi Inoue, Tokyo; Seiichiro Tsukui, Sayama; Masakazu Aoki, Tokorozawa; Shigeru Suzuki, Kokubunji; Masashi Horiguchi, Kawasaki, all of Japan

[73] Assignees: Hitachi, Ltd., Tokyo; Hitachi Tohbu Semiconductor, Ltd., Sairama, both of Japan

[21] Appl. No.: 590,608

[22] Filed: Jan. 24, 1996

[30] Foreign Application Priority Data

Jan. 27, 1995 [JP] Japan ................... 7-031403

[51] Int. Cl.$^6$ ........................................ G11C 13/00
[52] U.S. Cl. ........................ 365/230.08; 365/200
[58] Field of Search ........................ 365/200, 230.08

[56] References Cited

U.S. PATENT DOCUMENTS 4,688,219  8/1987  Takemae .................. 365/200
5,193,071  3/1993  Umina et al. .
5,262,993  11/1993  Horiguchi et al. .

FOREIGN PATENT DOCUMENTS

0415408A2  3/1991  European Pat. Off. .
61-150200  7/1986  Japan .
4-181589   6/1992  Japan .

*Primary Examiner*—Terrell W. Fears
*Attorney, Agent, or Firm*—Antonelli, Terry, Stout & Kraus, LLP

[57] ABSTRACT

Input/output terminals of a first semiconductor memory device in which failures or defects exist in units of memory mats and input/output terminals of a second semiconductor memory device having redundant memory mats are connected to one another on a mounted substrate to thereby relieve the failures in the memory mat units. A power source is substantially cut off from supplying to a faulty memory mat.

5 Claims, 19 Drawing Sheets

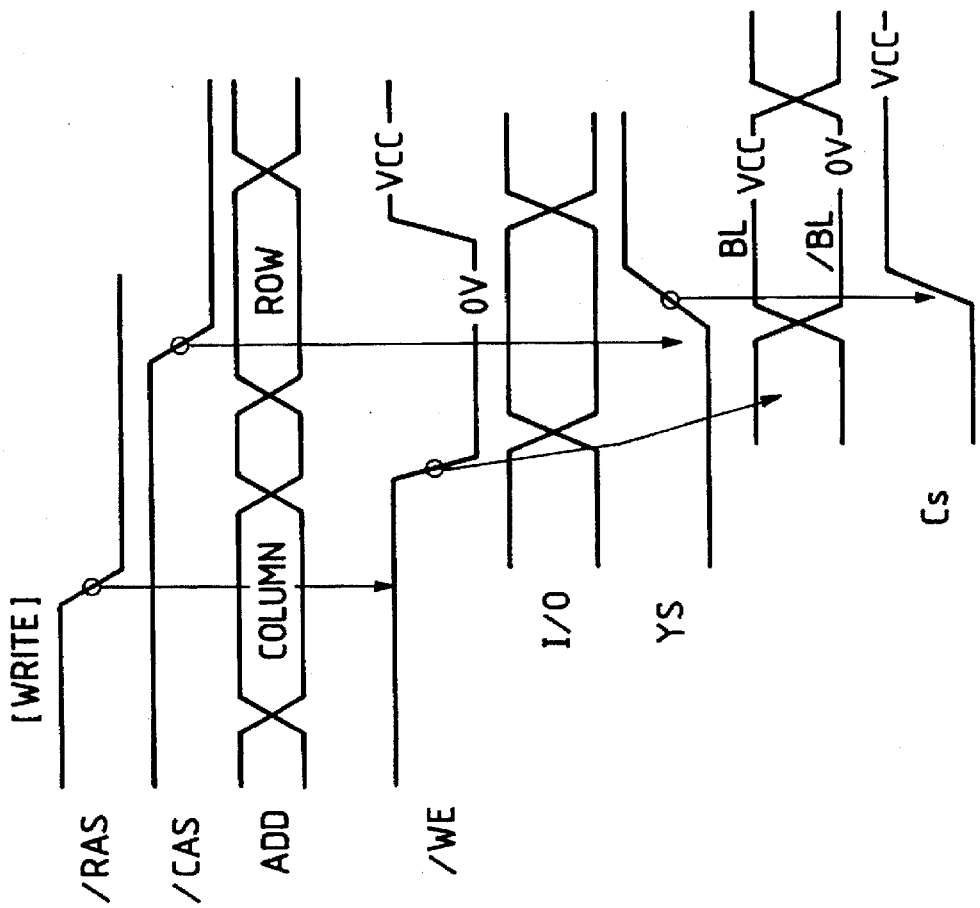
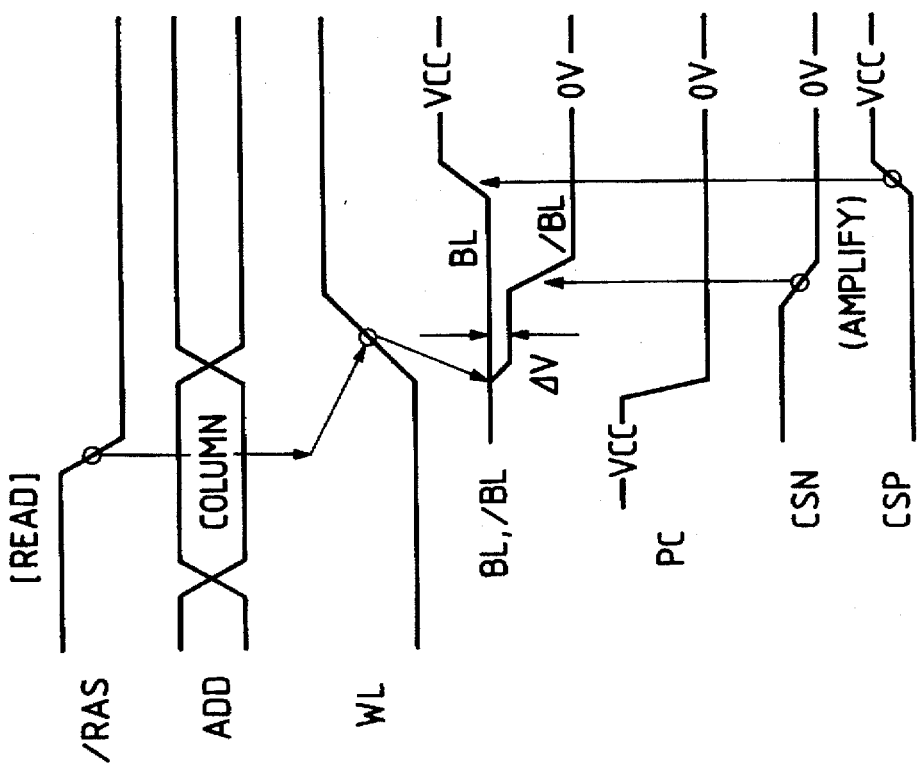
FIG. 4A
FIG. 4B

FIG. 10
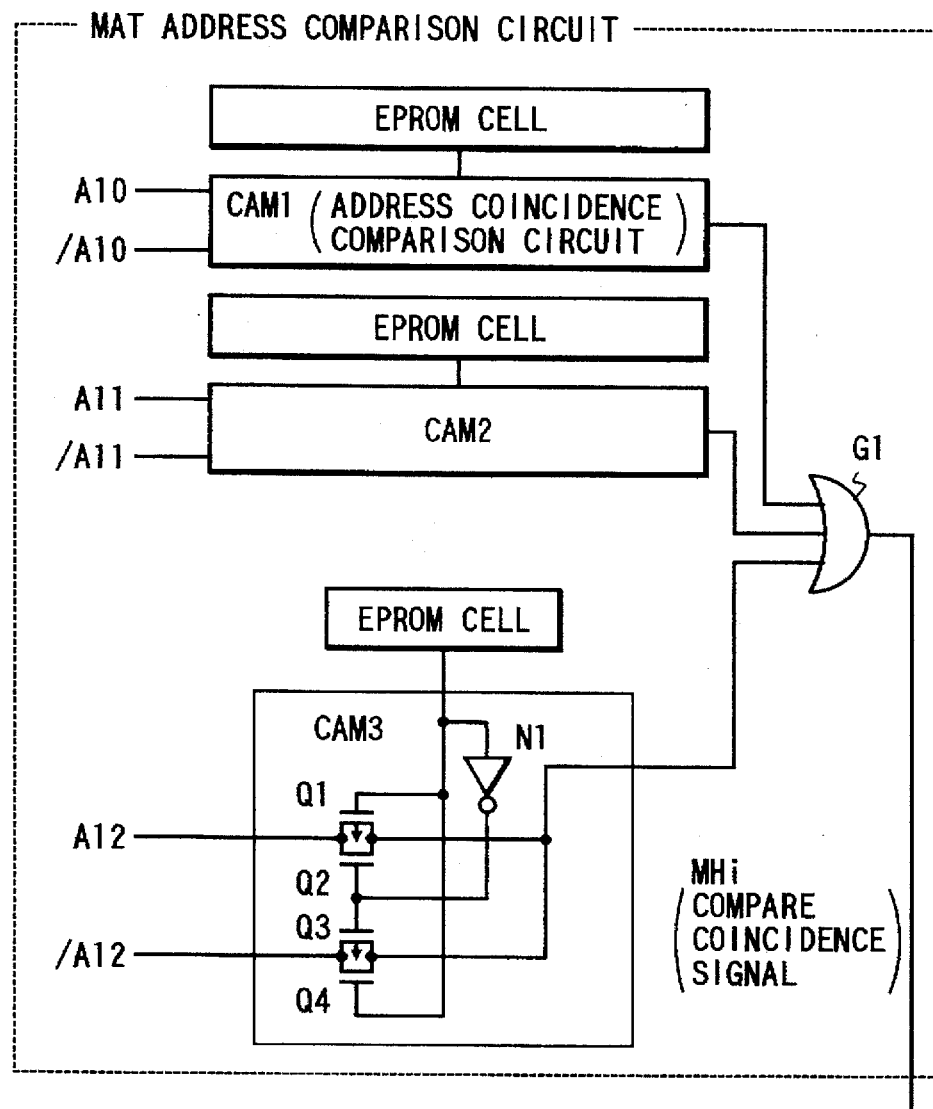
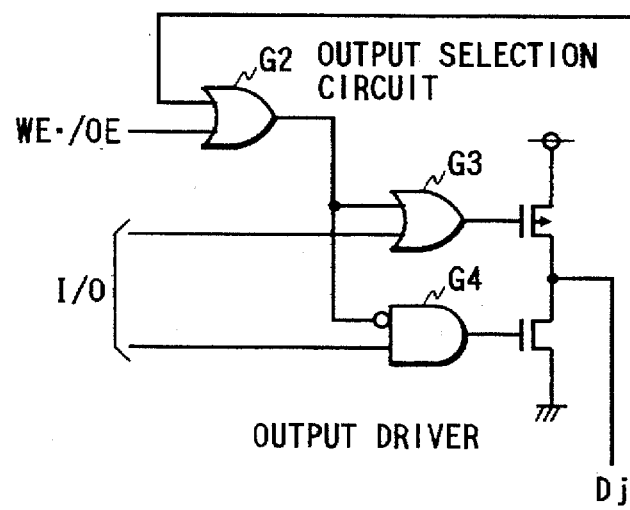

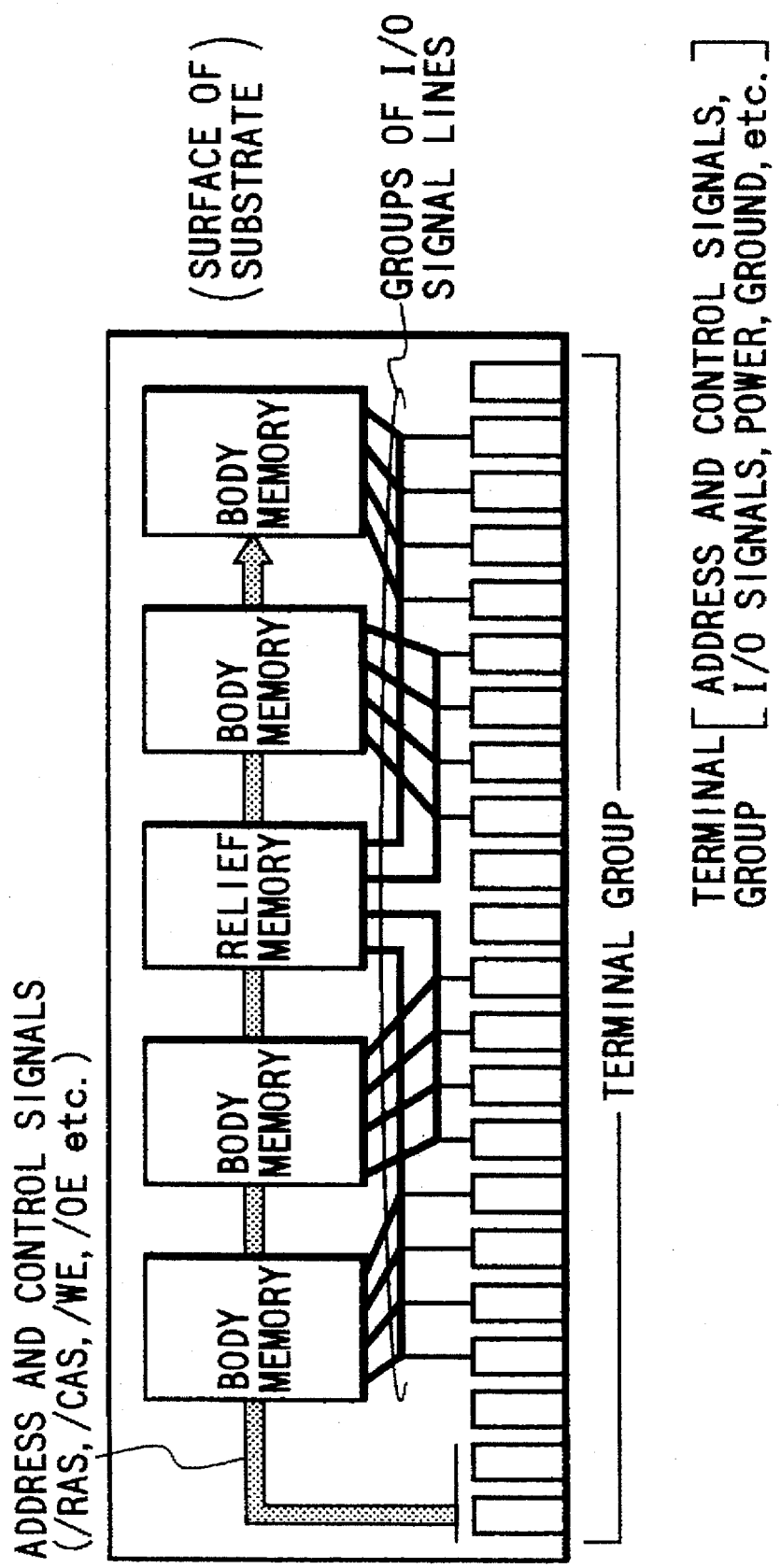

SEMICONDUCTOR MEMORY DEVICE AND MEMORY MODULE USING THE SAME

BACKGROUND OF THE INVENTION

The present invention relates to a semiconductor memory device and a memory module using it, and principally to a technique effective for use in a technique for relieving failures or defects developed in a dynamic RAM (random access memory) having a mass storage capacity. The defect relief technique has been disclosed in Japanese Patent Application Laid-Open Nos. 4-181589 and 61-150200.

In a semiconductor memory related to Japanese Patent Application Laid-Open No. 4-181589, the conventional relief of defects or failures developed in units of word lines or bit lines (data lines or digit lines) cannot be carried out. In order to relieve dc failures, a normal circuit is divided into a plurality of memory blocks (memory mats) and spare memory mats are formed so as to correspond to the memory blocks. When defects are produced in the memory blocks of the normal circuit, such memory blocks are all replaced with the spare memory mats.

SUMMARY OF THE INVENTION

The aforementioned defect relief technique is intended to form spare memory mats of large circuit scale within a single semiconductor chip. However, the efficiency of usage thereof is not so high. This is because defects can be relieved to some extent by the conventional technique for relieving them in the units of the word lines or bit lines. Thus, since most of semiconductor chips do not use the spare memory blocks even if the spare memory blocks are provided, the areas occupied by them substantially increase. It has been revealed from the discussions of the inventors of the present application that since the probability of defect relief in the units of the memory blocks is not so great in practice, it cannot be said that such a relief gains the superiority over the case where the semiconductor chips are abandoned as defective chips.

Namely, since the occupied areas increase in the semiconductor chips that perform the block relief and the number of semiconductor chips formable from a single semiconductor wafer is reduced, the number of products is not increased so far as a whole even if defects are relieved in block units. On the other hand, when only the conventional relief of defects in the units of the word lines or bit lines is made, the area occupied by each semiconductor chip is reduced correspondingly and hence the number of the semiconductor chips formable from the single semiconductor wafer can be increased. Thus, even if the semiconductor chips that need to perform the above relief of defects in the memory block units, are abandoned as the defective chips, the number of products is not so reduced as a whole.

An object of the present invention is to provide a semiconductor memory device having diversities and a memory module capable of enhancing substantial product yields using it. The above and other objects and novel features of the present invention will become apparent from the following description of the present specification and the accompanying drawings.

A summary of a typical one of the invention disclosed in the present application will be briefly described as follows: Namely, a circuit configuration is adopted which includes a plurality of memory mats each constructed such that an internal address signal or a predecode signal and a control signal are supplied through a first input buffer circuit, the address signal or the predecode signal is decoded by an address selection circuit to thereby select a memory cell in one or plural units from each memory array in which memory cells are provided in matrix form at points where a plurality of word lines and a plurality of bit lines intersect, and a second input buffer for receiving a signal to be written into the memory cell, an output buffer for outputting a signal read from the memory cell and storing means in which malfunction information is written, are provided to thereby substantially cut off the supply of power to a sense amplifier and its corresponding memory cell based on the malfunction signal stored in the storing means.

According to the above means, when a dc failure or defect occurs in the corresponding memory mat, such a memory mat can be electrically separated from others and used as a semiconductor memory device which makes the best use of the remaining portions.

A summary of another typical one of the invention disclosed in the present application will be briefly described as follows: Namely, there are provided a plurality of memory mats each constructed such that an internal address signal or a predecode signal and a control signal are supplied through a first input buffer circuit, the address signal or the predecode signal is decoded by an address selection circuit to thereby select a memory cell in one or plural units from each memory array in which memory cells are provided in matrix form at points where a plurality of word lines and a plurality of bit lines intersect and each comprising a second input buffer for receiving a signal to be written into the memory cell and an output buffer for outputting a signal read from the memory cell; storage circuits provided so as to correspond to the memory mats and in which address information are written; and a plurality of sets of input/output terminals at which the address information is compared with an address signal for designating each memory mat to detect that a memory mat associated with the address information has been selected, thereby validating the operation of the second input buffer or the output buffer of the corresponding memory mat and which are associated with the memory mats.

According to the above means, a semiconductor memory device in which a desired address is assigned to each storage circuit, can be obtained and utilized as a redundant semiconductor memory device, which performs the relief of failures or defects in units of the memory mats, as needed.

A summary of a further typical one of the invention disclosed in the present application will be briefly described as follows: Namely, a first semiconductor memory device having a plurality of memory mats each constructed such that an internal address signal or a predecode signal and a control signal are supplied through a first input buffer circuit, the address signal or the predecode signal is decoded by an address selection circuit to thereby select a memory cell in one or plural units from each memory array in which memory cells are provided in matrix form at points where a plurality of word lines and a plurality of bit lines intersect, and a second input buffer for receiving a signal to be written into the memory cell, an output buffer for outputting a signal read from the memory cell and storing means in which malfunction information is written, are provided to thereby substantially cut off the supply of power to a sense amplifier and its corresponding memory cell based on the malfunction signal stored in the storing means; and a second semiconductor memory device having a plurality of memory mats identical in configuration to the above memory mats, storage circuits provided so as to correspond to the plurality of memory mats and in which address information are written, and a plurality of sets of input/output terminals at which the address information is compared with an address signal for designating each memory mat to detect that a memory mat associated with the address information has been selected, thereby validating the operation of the second input buffer or the output buffer of the corresponding memory mat and which are associated with the memory mats, are both placed on a single mounted substrate. Further, a defective or faulty memory mat is electrically separated from others in the first semiconductor memory device. In the second semiconductor memory device, address information associated with the faulty memory mat is written into its corresponding storage circuit and external data terminals associated with the faulty memory mat and the above input/output terminals associated with the memory mat in the second semiconductor memory device are connected to one another on the mounted substrate so as to correspond to one another.

According to the above means, the second semiconductor memory device can be relieved on the mounted substrate in combination with the first semiconductor memory device while using the first semiconductor memory device in which failures or defects exist in memory mat units. It is therefore possible to enhance substantial yields of semiconductor memory devices.

BRIEF DESCRIPTION OF THE DRAWINGS

The invention will be described with reference to the accompanying drawings wherein:

FIG. 4 comprised at 4A and 4B is a timing chart for describing a schematic operation of a dynamic RAM according to the present invention;

FIG. 10 is a circuit diagram showing examples of an address comparison circuit, an output selection circuit and an output driver shown in FIG. 9;

FIG. 17 is a schematic configurational view illustrating a still further embodiment of a memory module according to the present invention;

DETAILED DESCRIPTION OF THE PREFERRED EMBODIMENTS

Figure 1:
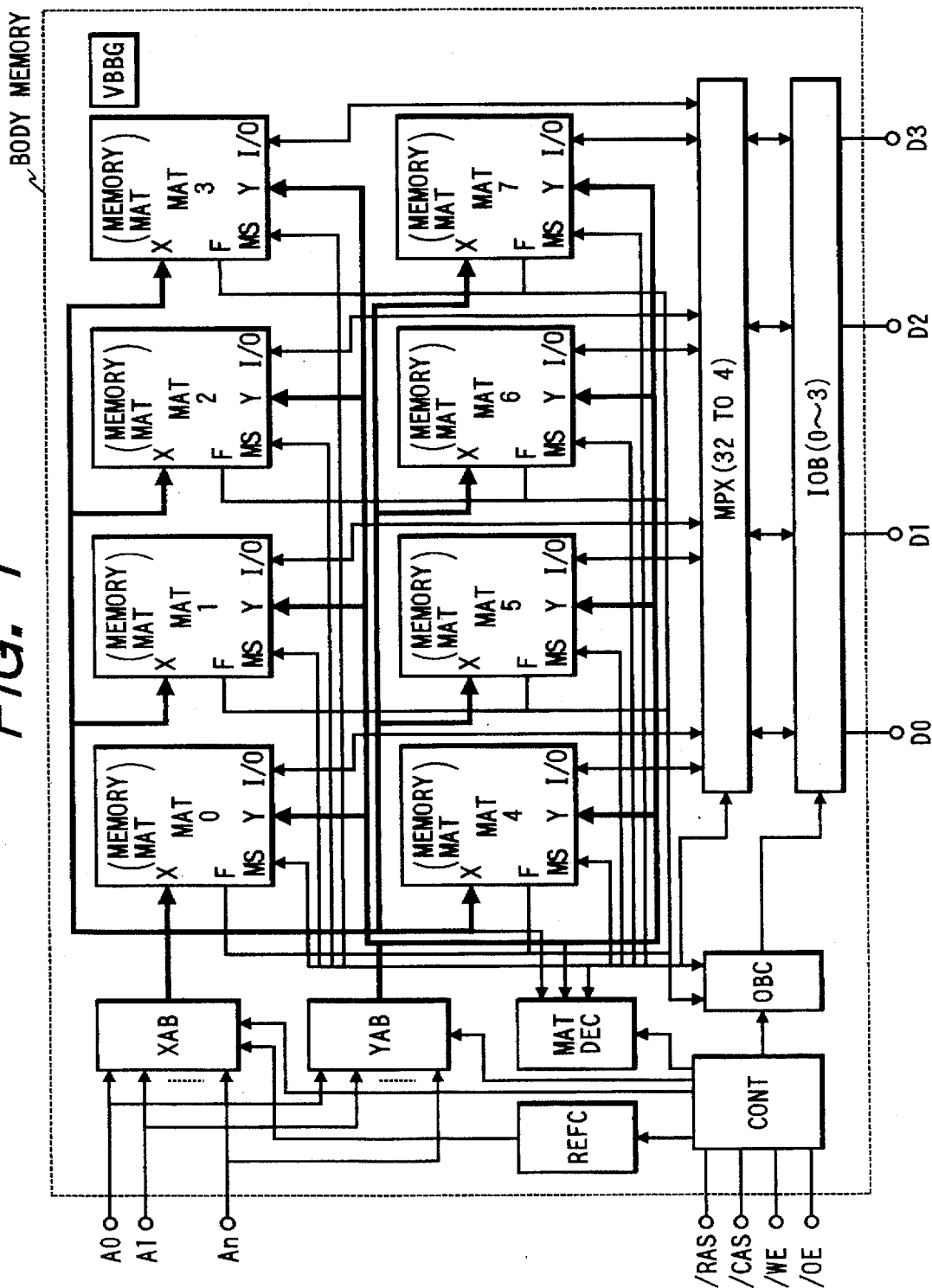
FIG. 1 is a schematic block diagram showing one embodiment of a semiconductor memory device according to the present invention.

FIG. 1 is a schematic block diagram showing one embodiment of a semiconductor memory device according to the present invention. Respective circuit blocks in the same drawing are formed on a single semiconductor substrate such as monocrystalline silicon by a known technique for manufacturing a semiconductor integrated circuit. The semiconductor memory device according to the present embodiment roughly comprises eight memory mats MAT0 through MAT7, an input/output interface and a control circuit. The input/output interface comprises address input buffers XAB and YAB, a data input/output buffer IOB and a multiplexer MPX.

The control circuit comprises a control circuit CONT for generating various control signals and timing signals required to activate internal circuits in response to control signals /RAS, /CAS, /WE and /OE supplied from external terminals, a mat decoder MATDEC for producing a signal for selecting each of the memory mats, an output control circuit OBC and a refresh control circuit REFC. Here, symbols / (slash) affixed to the control signals /RAS, /CAS, /WE and /OE are used as an alternative to overbars each of which represents that a low level is of an active level. A substrate bias circuit VBBG generates a backbias voltage to be supplied to the substrate in response to a source voltage supplied from an unillustrated source voltage terminal. The substrate bias circuit VBBG is not restricted in particular but is activated so as to change the capability of supplying a substrate current according to an operation mode in response to a control signal supplied from the control circuit CONT or a substrate potential monitor signal or the like and to keep a substrate potential substantially constant.

In the present embodiment, one memory mat is finally selected from the eight memory mats MAT0 through MAT7. An input/output I/O corresponding to the selected one memory mat is electrically connected to the data input/output buffer IOB through the multiplexer MPX. Namely, when data are input and output to and from data terminals D0 through D3 in 4-bit units as in the present embodiment, the data are similarly respectively input and output to and from the memory mats MAT0 through MAT7 in 4-bit units in correspondence to the data terminals D0 through D3.

Each of the memory mats MAT0 through MAT7 is regarded as equivalent to a single semiconductor memory as will be described later.

Of address signals supplied through the address buffers XAB and YAB, an address signal X for selecting a word line of each of the memory mats MAT0 through MAT7 and an address signal Y used for selecting each bit line are respectively supplied to each of the memory mats MAT0 through MAT7 through internal address buses. Further, an address signal for specifying or designating one of the memory mats MAT0 through MAT7 is decoded by the mat decoder MATDEC, which supplies a mat select signal to a select terminal MS of each of the memory mats MAT0 through MAT7. No particular restrictions are imposed on the mat decoder MATDEC where the eight memory mats MAT0 through MAT7 are used as described above. Since, however, for example, an X-system address signal is composed of two bits and a Y-system address signal is composed of one bit and they are decoded by the mat decoder MATDEC to select one memory mat, the aforementioned mat decoder MATDEC can be regarded as a kind of predecoder.

Figure 2:
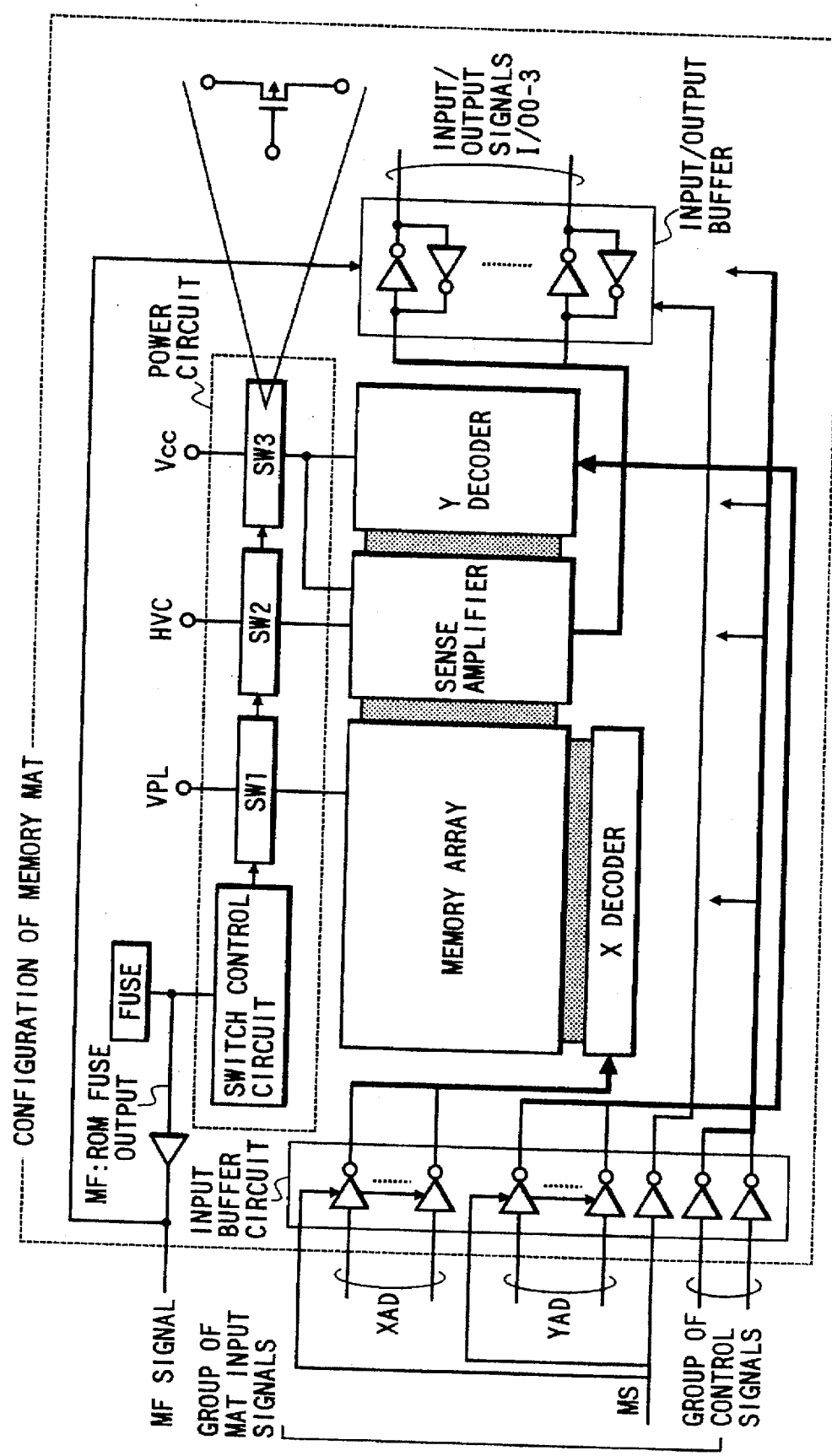
FIG. 2 is a block diagram illustrating one example of a memory mat employed in the semiconductor memory device shown in FIG. 1.

A block diagram of one example of each memory mat referred to above is shown in FIG. 2. An input buffer for taking in or capturing the address signals XAD and YAD and mat select signal MS supplied through the above internal address buses and the various control signals generated from the control circuit CONT is provided regardless of the fact that each of the memory mats MAT0 through MAT7 is formed as the single semiconductor memory, in other words, the aforementioned address buffers XAB and YAB or the like are formed.

This is because a three-state output function including an output high impedance of a clocked inverter circuit or the like is provided in the input buffer and when a dc failure occurs in the memory mat, the output of the input buffer is brought into high impedance to electrically isolate the memory mat from others, thereby preventing dc current from steadily flowing through the memory mat. Due to the above reason, an operating voltage Vcc of an internal circuit typified by a Y decoder is supplied through a switch SW3. Further, a plate voltage VPL of a memory array is also supplied through a switch SW1 similar to the above switch. Similarly, a half precharge voltage HVC supplied to a half precharge circuit included in a sense amplifier is also supplied through a switch SW2.

A fuse Fuse opens or burns when a dc malfunction or failure occurs in the memory array or the like and stores information about its failure. On the one hand, such information about its cutoff is sent to a switch control circuit so that each of the switches SW1, SW2 and SW3 is brought into a cutoff state. Further, the output control circuit OBC shown in FIG. 1 is brought into output high impedance through the output buffer and the input and output buffers of the input/output buffer, each of which includes a three-state output function in the same manner as described above, are both brought into output high impedance.

The address signal XAD sent through the input buffer circuit is supplied to an X decoder where a single word line of the memory array is selected. A word line driver is also included in the X decoder. The address signal YAD sent through the input buffer circuit is supplied to a Y decoder where a Y select signal for four pairs of complementary bit lines of the memory array is formed. The Y select signal is transferred to a column switch for connecting the complementary bit lines of the memory array, which are included in the sense amplifier, to their corresponding input/output lines. The input/output lines are electrically connected to the input/output buffer so as to correspond to the input/output buffer.

In the present embodiment, X- and Y-system redundant circuits are also provided although not shown in the drawing. The X-system redundant circuit includes a storage circuit for storing a failure address therein and an address comparison circuit. The stored failure address is compared with the input X address. When they mismatch with each other, the X-system redundant circuit selects a word line corresponding to the input address as it is. When they match with each other, the X-system redundant circuit prohibits a normal circuit from selecting a defective word line and outputs a signal for selecting a spare word line therefrom. The same circuits as described above are also provided in the Y-system redundant circuit. When a memory access to a defective or failure bit line is detected by the Y-system redundant circuit, the Y-system redundant circuit stops the operation of selecting the failure bit line by the Y decoder and alternatively forms a signal for selecting a bit line provided as a spare.

Figure 3:
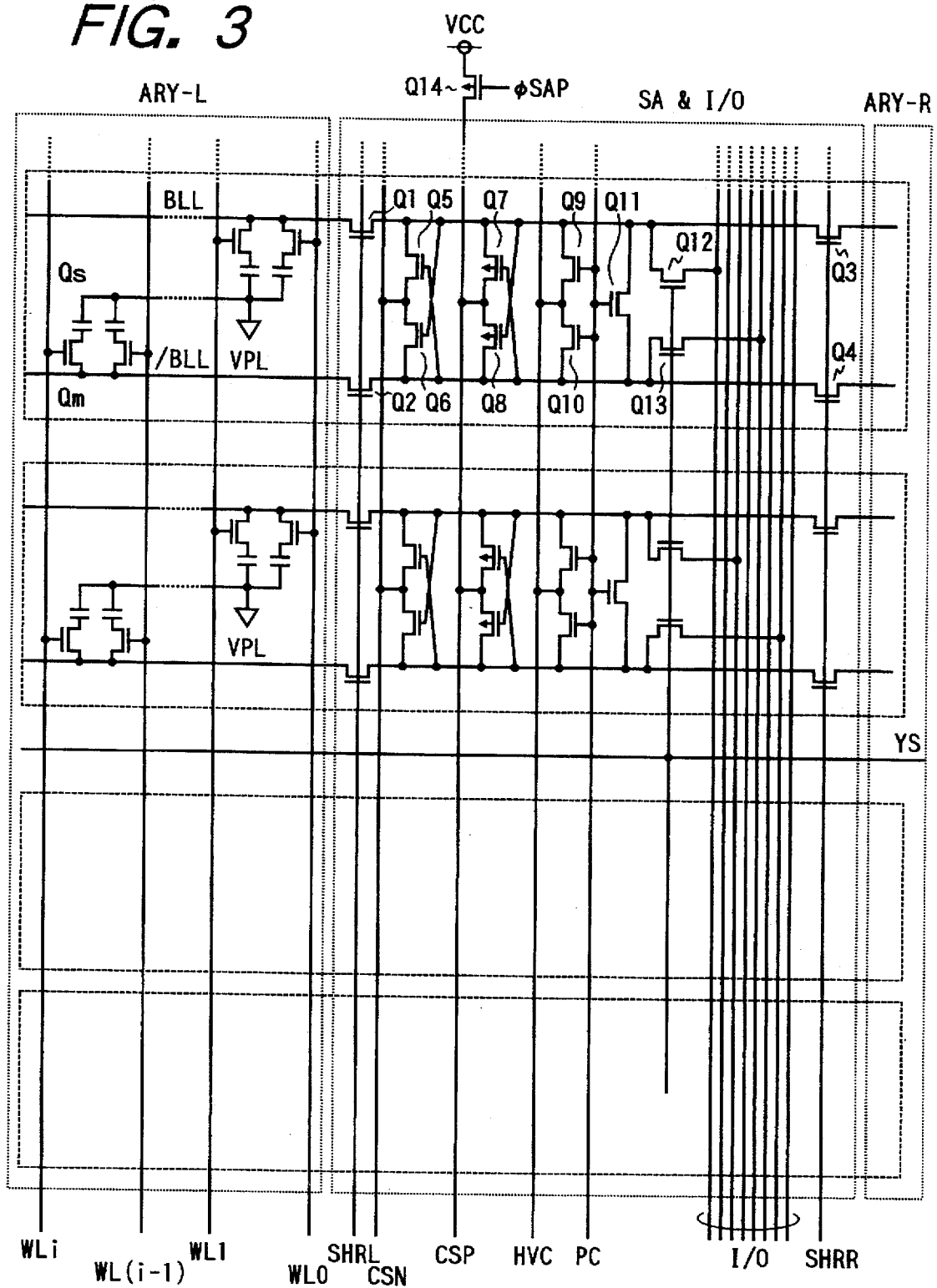
FIG. 3 is a fragmentary circuit diagram depicting one example of a memory array employed in the memory mat shown in FIG. 2.

A fragmentary circuit diagram showing one example of the memory array is shown in FIG. 3. In the same drawing, four word lines, two pairs of complementary bit lines, sense amplifiers and precharge circuits related to these, etc. are typically illustrated by way example. The same drawing illustrates a so-called shared sense system in which memory arrays ARY-L and ARY-R are disposed on the left and right sides with each sense amplifier as the center. Of these, the left array ARY-L is shown as described above whereas the right array ARY-R is represented by a black box. Further, circuit symbols are affixed only to MOSFETs that constitute each circuit associated with a pair of complementary bit lines BLL and /BLL, as representative ones.

A dynamic type memory cell comprises a pair of address selection MOSFETs Qm and a pair of information storage capacitors Cs. The gate of each address selection MOSFET Qm is electrically connected to its corresponding word line WLi and the drain thereof is electrically connected to its corresponding bit line /BLL. Each information storage capacitor Cs is electrically connected to the source of the address selection MOSFET Qm. Other electrodes of the information storage capacitors Cs are made common and supplied with the plate voltage VPL.

Each pair of bit lines BLL and /BLL is disposed in parallel as shown in the same drawing and is caused to intersect each other as needed in order to keep a balance in capacity of each bit line, for example. The complementary bit lines BLL and /BLL are electrically connected to their corresponding input/output nodes of each sense amplifier by switches MOSFETS Q1 and Q2. The sense amplifier comprises N channel MOSFETs Q5 and Q6 whose gates and drains are respectively electrically cross-connected to one another and brought into latch configurations and P channel MOSFETs Q7 and Q8 whose gates and drains are respectively electrically connected to one another and brought into latch configurations. The sources of the N channel MOSFETs Q5 and Q6 are electrically connected to a common source line CSN. The sources of the P channel MOSFETs Q7 and Q8 are electrically connected to a common source line CSP. As is shown on the common source line CSP by way of illustration, a power switch MOSFET Q14 for the P channel MOSFETs is provided. When a timing signal φSAP is brought into a low level, the power switch MOSFET Q14 is turned on and hence supplies a voltage required to active each sense amplifier. The common source line CSN associated with the N channel MOSFETs Q5 and Q6 is provided with an unillustrated N channel MOSFET, which supplies a circuit ground potential in unison with line operation timing.

In order to provide stable sense operations by the power switch MOSFET for activating these sense amplifiers, a power switch capable of supplying only a relatively small current when the corresponding sense amplifier starts its amplifying operation, is brought into an on state, and a power switch MOSFET capable of supplying a large current when the difference in potential between each pair of bit lines BLL and /BLL becomes large to some extent according to the amplifying operation of the sense amplifier, is turned on, whereby the amplifying operation of each sense amplifier is stepwise carried out.

In order to activate and deactivate the above sense amplifiers and prevent the dc current from flowing in those associated with a memory mat in which a dc failure has occurred as will be described later, the power switch MOSFET Q14 and the like are used for steadily bringing them into an off state based on the malfunction information MF stored due to the burning of the above fuse. Namely, the power switch MOSFET Q14 and the like are also used so as to serve as the power switch shown in FIG. 2.

The precharge circuit composed of a MOSFET Q11 for short-circuiting the complementary bit lines and switches MOSFETs Q9 and Q11 for supplying the half precharge voltage HVC to the complementary bit lines is provided between the input/output nodes of each sense amplifier. The gates of these MOSFETs Q9 through Q11 are commonly supplied with a precharge signal PC. The precharge signal PC is fixed to a low level based on the malfunction information MF and is also used to turn off the MOSFETs Q9 through Q11 or the like. Simultaneously, the switch SW2 activated so as to supply the half precharge voltage HVC itself is also brought into an off state in the same manner as described above. Thus, the cutting off of the half precharge voltage HVC itself is carried out to cope with or correspond even to the case where such a dc failure that a signal path for supplying the half precharge voltage HVC is short-circuited relative to the circuit ground potential or the source voltage or the like, occurs.

MOSFETs Q12 and Q13 constitute a column switch switch-controlled by a column select signal YS. In the present embodiment, four pairs of bit lines can be selected by a single column select signal YS. Therefore, the column select signal YS is commonly supplied to the gates of the MOSFETs forming column switches provided between input/output nodes of four sense amplifiers corresponding to the two pairs of bit lines shown in the same drawing by way of illustration and the unillustrated remaining two pairs of bit lines. Thus, the four pairs of bit lines and four pairs of input/output lines I/O are respectively connected to one another through such switches MOSFETs.

A timing chart for describing a schematic operation of a dynamic RAM according to the present invention is shown in FIG. 4. One example of a read operation (READ) is illustrated in FIG. 4(A). A row (row system) address signal ADD is captured in synchronism with a low level of a row address strobe signal /RAS and decoded to select a word line WL. Prior to the selection of the word line, a precharge signal PC is brought into a low level and a pair of bit lines BL and /BL holds a half precharge voltage in a floating state. If the word line is selected, a memory cell electrically connected to, for example, the bit line /BL of the complementary bit lines BL and /BL is selected and the stored information held in the memory cell is 0V, then the potential at the bit line /BL is reduced by ΔV due to a charge share with the bit line /BL. On the other hand, the bit line BL to which no memory cell is connected, holds the half precharge voltage.

When the sense amplifier activation signal (common source line) CSN is rendered low in level, the amplification MOSFETs Q5 and Q6 on the N channel side of the sense amplifier start an amplifying operation to lead the bit line /BL on the low level side to a low level. Further, the MOSFETs Q7 and Q8 on the P channel side start an amplifying operation in response to the activation signal (common source line) CSP brought into a high level with a delay to raise the bit line BL on the high level side to a high level such as the source voltage Vcc.

In the shared sense amplifier described above, the MOSFETs Q1 and Q2 or Q3 and Q4 on the side of the memory array in which no word lines are selected, are turned off in response to a low level of a select signal SHRL or SHRR before the sense amplifier starts its amplifying operation. A signal for amplifying the sense amplifier is written into the selected memory cell. Namely, a ground potential 0V of a circuit associated with the bit line /BL is re-written (refreshed) into its corresponding information storage capacitor of the memory cell. Although not shown in the drawing, a Y-system selecting operation is thereafter carried out so that an amplification signal for the selected bit line is outputted.

One example of a write operation (WRITE) is illustrated in FIG. 4(B). A row (row system) address signal ADD is captured in synchronism with a low level of a row address strobe signal /RAS in the same manner as described above and decoded to select a word line WL. Although not shown in the same drawing, a precharge signal PC is rendered low in level prior to the selecting operation of the word line, and a pair of bit lines BL and /BL holds a half precharge voltage in a floating state. Next, the operation of selecting the word line is performed and a read signal of ΔV is obtained at either one of the pair of complementary bit lines BL and /BL and amplified by the corresponding sense amplifier. The original stored information is written into a selected memory cell so that a refresh operation is performed.

Upon the write operation, a write enable signal /WE is rendered low in level. Correspondingly, an input buffer becomes effective or valid so that a write signal is supplied to the corresponding pair of input/output lines I/O. A column (column system) address signal ADD is captured in synchronism with a low level of a column address strobe signal /RAS and decoded to form a select signal YS for a pair of complementary bit lines. Thus, the column switches MOSFETs Q12 and Q13 or the like are turned on so that the selected complementary bit lines BL and /BL in the corresponding memory array and their corresponding pair of input/output lines I/O are respectively connected to one another. Therefore, since the write signal is transferred to the selected pair of complementary bit lines BL and /BL, the level held by each storage capacitor Cs of the memory cell is changed to, for example, a high level corresponding to the write signal.

Figure 5:
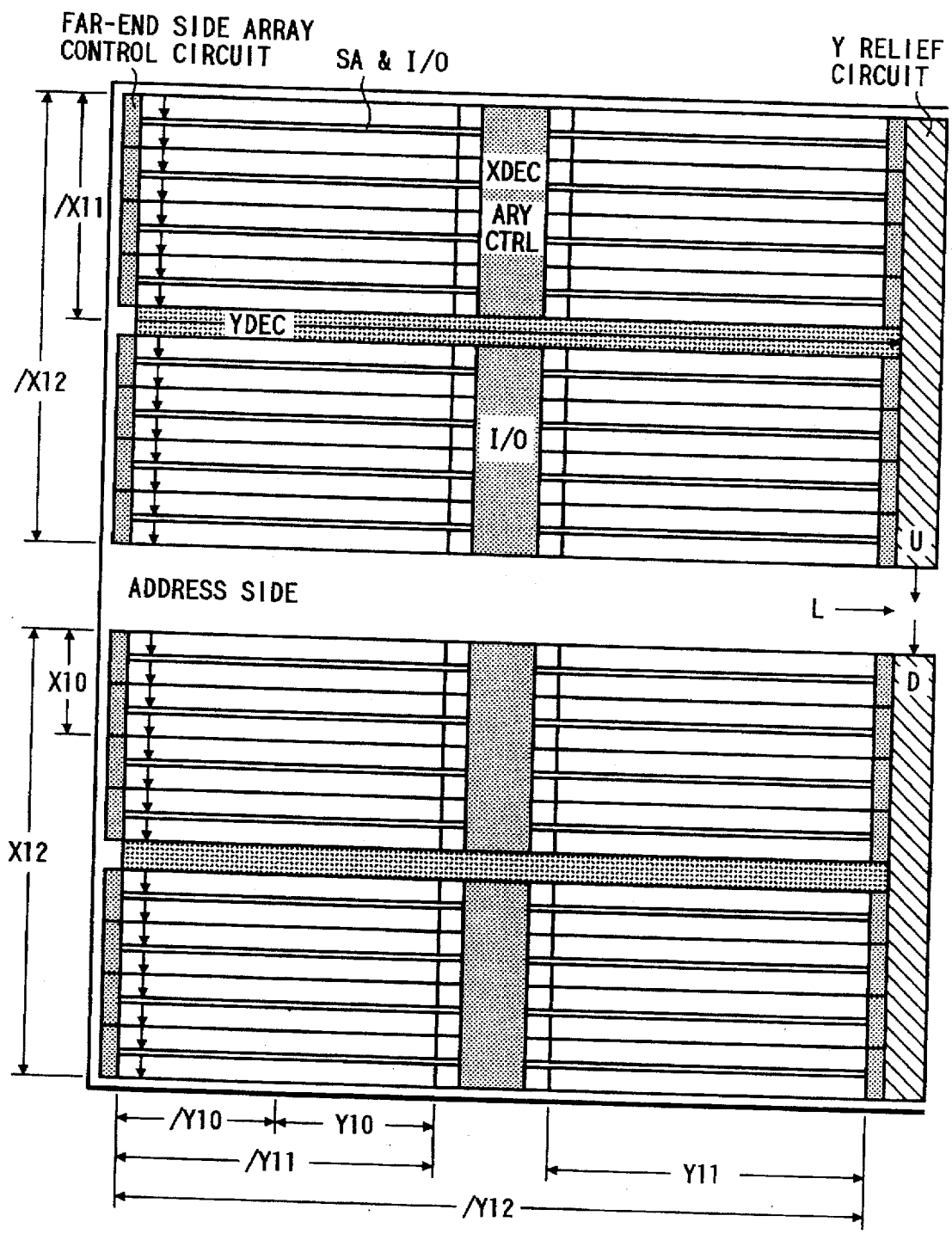
FIG. 5 is a layout plan of a half memory array showing one example of the dynamic RAM to which the invention is applied.
Figure 6:
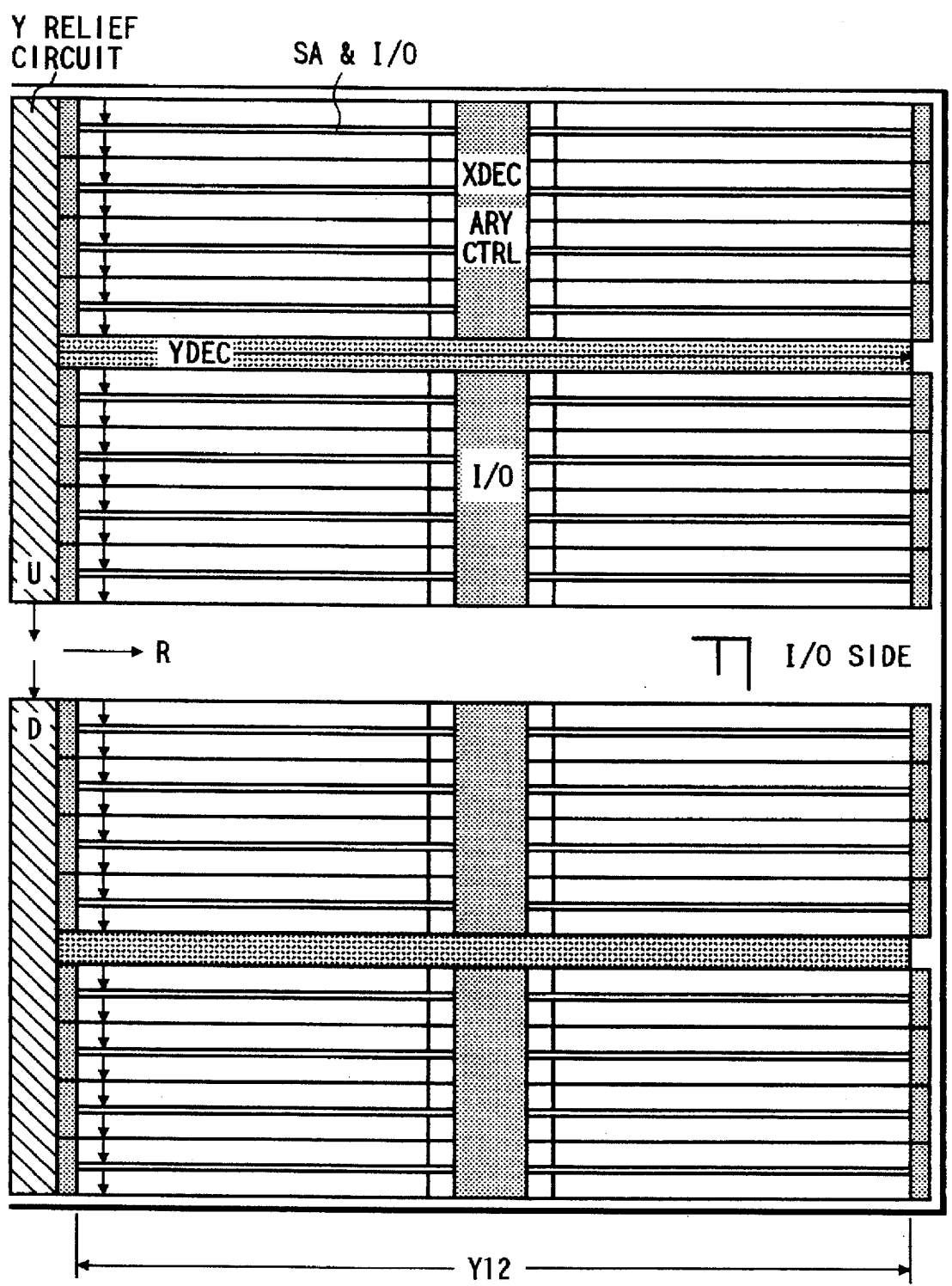
FIG. 6 is a layout plan of the remaining half memory array showing the above example of the dynamic RAM shown in FIG. 5.

Layout plans of memory arrays showing one example of the dynamic RAM to which the invention is applied, are shown in FIGS. 5 and 6. The dynamic RAM according to the present embodiment is not restricted in particular but has a storage capacity of about 64 Mbits. The chip layout plans drawn by left and right halves (L, R) of a chip long from side to side are shown in FIGS. 5 and 6. A Y save or relief circuit provided in the center of the chip is shown so as to overlap on both drawings. The Y relief circuit is used to save or relieve a malfunction or failure developed in units of each pair of complementary bit lines as described above.

Sense amplifiers and input/output lines (SA & I/O) are provided with two memory arrays as the center. An address layout or assignment will be described with an access made in a one-bit unit as one example. The most significant bits /X12 and X12 of an X address are assigned to an upper side U and a lower side L. Address signals /X11 and X11 are respectively assigned to memory arrays divided into two groups set by eight with the Y decoders YDEC as the center. A lower half specified by the X11 is omitted in the same drawing. The eight memory arrays divided into the two groups are divided by four and addresses /X10 and X10 are respectively assigned to the divided ones. The address X10 assigned to the four memory arrays on the lower side L is shown by way of illustration as relative magnitude. Although not shown in the same drawing, addresses /X9 and X9 are respectively assigned to memory arrays provided by two, which are divided with each sense amplifier as the center. Addresses /X8 and X8 are respectively assigned to memory arrays divided with each sense amplifier as the center.

A row decoder XDEC and an array control circuit ARYCTRL and out-of-mat input/output lines I/O provided in the longitudinal (vertical) direction of the chip respectively comprise a word driver WD, an X decoder and a mat control circuit MATCTRL, and out-of-mat input/output lines. Input/output interface circuits such as input and output buffers on the address and I/O sides are provided in the longitudinally-extending center of the chip.

Arrows affixed to the memory mat indicate the direction of addresses. Namely, refreshes are successively carried out toward the direction from top to bottom in the same drawing. When the refreshes are performed in turn in the direction indicated by the arrows shown in the same drawing, 8192 cycles are reached. Thus, if the memory access is restricted, then all the refreshes can be completed in 1024 cycles by simultaneously selecting memory mats designated by the addresses X12, X11 and X10, for example, and simultaneously refreshing the eight memory mats. An address assignment in the column direction is carried out in such a manner that the most significant bits /Y12 and Y12 of a Y address are assigned to the left and right sides with the Y relief circuit interposed therebetween. Address signals /Y11 and Y11 are assigned to the memory arrays divided into the left and right sides with the X decoder XDEC and the like as the center. Further, the /X10 and X10 are assigned to each individual memory array.

In the present embodiment, the whole is divided into eight blocks, which are used as the memory mats. The memory accesses are finally carried out in units of the memory mats. When the whole is divided into eight blocks by the X12, X11 and Y12, for example, memory arrays divided by four along the longitudinal direction by the Y decoders YDEC are respectively regarded as a single memory mat in FIGS. 5 and 6. Further, when it is desired to simultaneously select the four pairs of bit lines within each memory array as described above and allow the selected bit lines to provide outputs as they are, the X and Y addresses are respectively reduced by one bit. Therefore, the above address assignment is performed such that the X12, X11 and Y12 are respectively set to the X11, X10 and Y11. In this condition, the single memory mat may be accessed in 4-bit units.

However, if this processing exerts bad influences on the memory access, such as an increase in load imposed on a word driver due to an increase in the number of complementary bit lines associated with a single word line and an increase in the number of memory cells connected to the word line, then the memory arrays may be configured so as to be suitably divided in the word line direction. Thus, various embodied configurations can be adopted as the layouts of the memory arrays.

When the single memory mat is specified by the X address signal and the Y address signal as described above, a Y address is placed in an input waiting state and the finally-selected memory mat is determined upon its input. Therefore, when only the single memory mat is activated based on the final mat select signal, the memory access is delayed. Thus, the row-system address selecting operations are simultaneously effected on two memory mats specified by the X address, of the above eight memory mats. Further, the input/output buffer associated with the single memory mat designated by the input of the Y address is made valid so that the final single memory mat is operated. Therefore, since only row-system selecting operations are performed on other memory mats, a refresh operation is carried out as it were.

Only a single memory mat designated by the X address alone and including a row-system address selection circuit and an input buffer for inputting an address signal and the like may be brought into an operating state. When done in this way, the X address for specifying the word line, which is supplied to the inside of the memory mat, and the Y address are kept off-balance. However, the relationship between the bit lines and word lines within each memory array can be optimized by means or contrivances such as a means for assigning a plurality of pairs of bit lines to a single Y address and performing memory accesses in units of a plurality of bits, etc.

Figure 7:
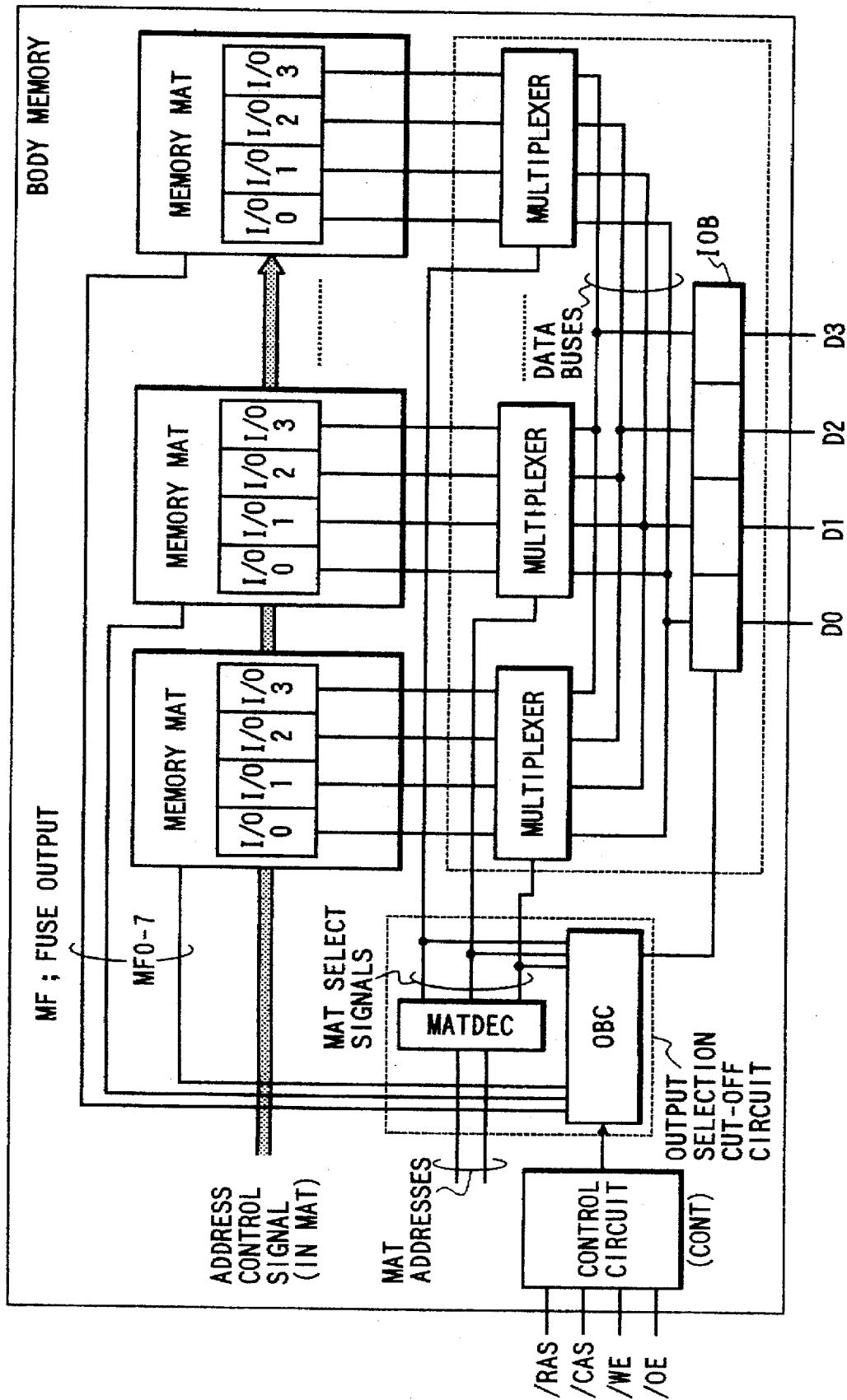
FIG. 7 is a schematic block diagram illustrating another embodiment of a semiconductor memory device according to the present invention.

A schematic block diagram of one embodiment showing a semiconductor memory device according to the present invention is shown in FIG. 7. Respective circuit blocks shown in the same drawing are used for describing the relationship between the memory mats, the multiplexers MPX and the input/output circuit IOB shown in FIG. 1. An output selection cut-off circuit shown in the same drawing comprises the mat decoder MATDEC and the output control circuit OBC.

The output selection cut-off circuit has the function of performing control on the normal operation of the data input/output buffer IOB in response to failure or malfunction information MF0 through 7 from faulty or imperfect memory mats, mat select signals from the mat decoder MATDEC and a control signal outputted from the control circuit and bringing an output buffer into an output high impedance in response to an output operation given from each imperfect memory mat. Namely, when the output selection cut-off circuit is in normal operation, the input buffer of the data input/output buffer is brought into an operating state and the output buffer is brought into an output high impedance upon a write operation. Upon a read operation, the input buffer is brought into an output high impedance and the output buffer is brought into an operating state. When no memory is accessed, the input and output buffers are both brought into the output high impedance. When a read instruction or designation is issued from the corresponding imperfect memory mat upon the read operation in addition to such operation control, the output buffer is brought into the output high impedance.

Each mat select signal forms a signal for the selection of a multiplexer provided so as to correspond to input/output circuits I/O0 through I/O3 of each memory mat. When an input/output buffer is provided in the data input/output circuit of each memory mat as in the case of the aforementioned embodiment and the function of forcedly bringing it into an output high impedance based on the malfunction information is provided, the corresponding multiplexer can be omitted. When such a multiplexer is provided to the contrary, the aforementioned input/output buffer can be omitted from being provided on the memory mat side. Namely, the same output high impedance as described above may be created by each multiplexer. When done in this way, a control signal inputted to each multiplexer is regarded as a control signal obtained by ANDing malfunction information MF from a memory mat and a corresponding mat select signal.

Figure 8:
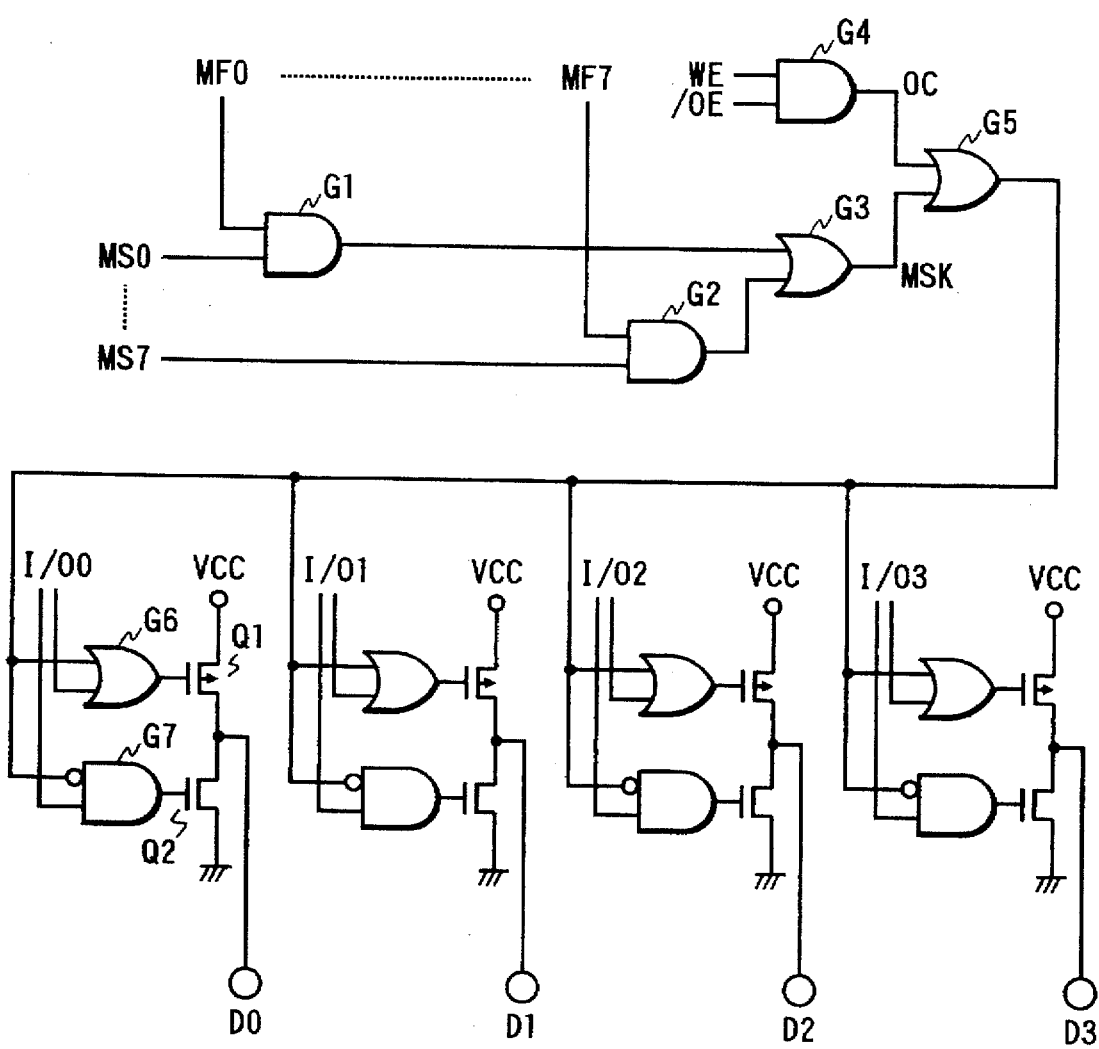
FIG. 8 is a circuit diagram showing one example of an output buffer included in each of an output buffer circuit OBC and a data input/output buffer IOB both shown in FIG. 7.

A circuit diagram of examples of the output control circuit OBC and the output buffers included in the data input/output buffer IOB is shown in FIG. 8. In the output control circuit, mat select signals MS0 and MS7 shown as typical ones by way of illustration and malfunction information MF0 and MF7 associated with these signals and supplied from unillustrated memory mats MAT0 and MAT7 are respectively supplied to AND gate circuits G1 and G2. Unillustrated other mat select signals and malfunction information associated with the signals are also supplied to their corresponding gate circuits in the same manner as described above. Signals outputted from the AND gate circuits G1 and G2 and the unillustrated other similar gate circuits are supplied to an OR gate circuit G3 from which a mask signal MSK is produced. Although circuit symbols of MOSFETs shown by way of illustration overlap with those shown in FIG. 3 to prevent the circuit diagram from becoming complex in the same drawing, they are used to implement separate circuit functions.

A write enable signal WE and an output enable signal /OE are supplied to an AND gate circuit G4 where an output control signal OC is formed. Namely, where the output enable signal /OE is high in level when a read operation is designated according to a high level of the write enable signal WE, each output buffer is brought into a non-operating state. Further, the control signal OC is rendered low in level in synchronism with a low level of the signal /OE to active each output buffer.

When, however, a memory access is made to an imperfect memory mat, a malfunction or failure signal MFi and a mat select signal MSi are both brought into high levels so that the mask signal MSK is rendered high in level. Thus, even when the write enable signal WE is rendered high in level and the output enable signal /OE is rendered low in level, the gate of a P channel output MOSFET Q1 of the corresponding output buffer is supplied with a high level through an OR gate circuit G6 in response to the high level of the mask signal MSK and the gate of an N channel output MOSFET Q2 thereof is supplied with a low level through an AND gate circuit G7 in response thereto. Therefore, an output terminal D0 of the corresponding output buffer is brought into an output high impedance. Output buffers connected to other three data terminals D1 through D3 are set in the same manner as described above.

Figure 9:
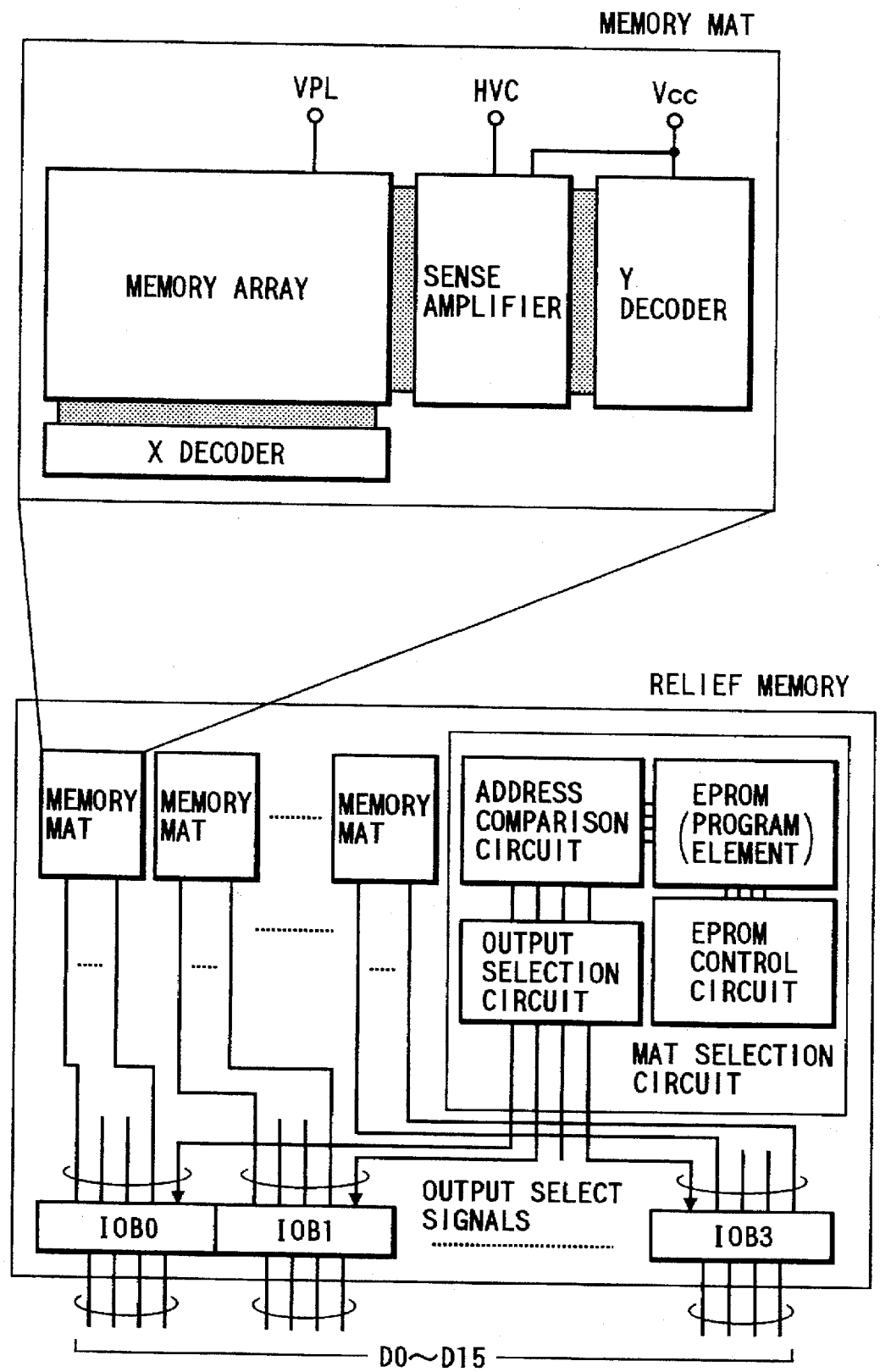
FIG. 9 is a schematic block diagram illustrating a further embodiment of a semiconductor memory device according to the present invention.

A schematic block diagram showing another embodiment of a semiconductor memory device according to the present invention is shown in FIG. 9. A schematic entire block of the semiconductor memory device and an enlarged block of a single memory mat formed therein are illustrated in the same drawing. However, other semiconductor memory devices according to the present invention are principally used as the failure save or relief memory employed in the semiconductor memory device shown in FIG. 1. Therefore, portions different from those employed in the semiconductor memory device shown in FIG. 1 are principally illustrated in the same drawing. Thus, an input buffer supplied with address signals and control signals, a control circuit and a substrate voltage generating circuit, etc. which are necessary for the semiconductor memory device, are omitted. Respective circuit blocks shown in the same drawing are formed on a single semiconductor substrate such as monocrystalline silicon by the known technique for manufacturing the semiconductor integrated circuit in the same manner as described above.

Each of memory mats employed in the present embodiment is composed of a memory array, an X decoder, a sense amplifier and a Y decoder configured in a manner substantially similar to those shown in FIG. 1. Since the present embodiment is set forth on the assumption that it is used for saving or relief, a fuse and a switch circuit are omitted so as to be able to cope with the case where a failure occurs in each memory mat.

Although a particular restriction is not made in the present embodiment, the number of memory mats is set to four as a whole and input/output lines of the respective memory mats extend as they are so as to be supplied to their corresponding data input/output circuits IOB0 through IOB3. The data input/output circuits IOB0 through IOB3 associated with the memory mats are electrically connected to their corresponding separate data terminals D0 through D15. Namely, the four data terminals are respectively provided so as to correspond to the data input/output circuit associated with each memory mat. The sixteen data terminals D0 through D15 are provided so as to correspond to the four sets of data input/output circuits IOB0 through IOB3.

An EPROM for storing addresses for an imperfect or faulty memory mat therein is provided to principally relieve its failure or malfunction in a memory mat unit. The EPROM employed in the present embodiment is not in the sense of being renewable (erasable & programmable) but in the sense of using an electrically writable memory cell identical to that employed in the known EPROM. Namely, the EPROM is used as a ROM for disabling an ultraviolet rays erasing function thereof and capable of writing data therein only one time. An EPROM control circuit is of a control circuit for writing data into the EPROM and reading it therefrom.

When the semiconductor memory device is composed of the above four memory mats, for example, four bits comprised of addresses set by three bits associated with each of the memory mats MAT0 through MAT7 of the semiconductor memory device shown in FIG. 1 and a flag bit indicative of whether the three bits are valid or invalid, are assigned to each memory mat so as to correspond to a single word line. Sixteen memory cells are connected in total in the case of the four memory mats. When the four memory mats are all used for failure relief, for example, the addresses assigned to each memory mat and the flag bit indicative of validity of the addresses are written in accordance with a combination of 0 and 1.

When a memory access is made, the above word line is selected and address signals and flag bits associated with the four memory mats are read out and supplied to an address comparison circuit. The address comparison circuit comprises four comparison circuits corresponding to each memory mat, where the address signals inputted thereto and address information read from the EPROM are compared. When the flag bit is made invalid at this time, an output indicative of the result of address comparison is rendered invalid. Namely, this is made to prevent a memory mat brought into 000 or the like due to being unused for the failure relief from being selected when a memory mat set as 000 is specified.

When an address for specifying a memory mat comprises an X address and a Y address, the precedently-input X address is first compared with the address information. If they match each other at this time, a row-system selecting operation of a memory mat associated with its matching is performed. If it is judged from the input of the Y address that it is of a mismatch address, then the memory mat is not finally selected and hence only a refresh operation is carried out within the corresponding memory mat.

A compare match or coincidence signal formed in a memory mat unit by the address comparison circuit is supplied to an output selection circuit. Namely, when a memory access associated with an imperfect memory mat is made, one of the memory mats in the semiconductor memory device according to the present embodiment in place of the imperfect memory mat is accessed in the above-described manner and hence the operation of any one of the data input/output circuits is made valid, whereby a write or read operation is performed.

A circuit diagram illustrative of examples of the address comparison circuit, the output selection circuit and an output driver is shown in FIG. 10. As one circuit CAM3 in the address comparison circuit is shown as a representative by way of illustration, a pair of complementary address signals A12 and /A12 is captured through transfer gates MOSFETs Q1 through Q4 switch-controlled based on information stored in an EPROM cell and its inverted signal. When the information stored in the EPROM cell is of a low level indicative of 0, for example, the P channel MOSFET Q1 and the N channel MOSFET Q2 corresponding to the address signal A12 are turned on. When the address signal A12 is low in level at this time, a match or coincidence signal is outputted as a low level. If the address signal A12 is high in level, then a mismatch signal is outputted as a high level. When the information stored in the EPROM cell is of a high level indicative of 1 to the contrary, the P channel MOSFET Q3 and the N channel MOSFET Q4 corresponding to the address signal /A12 are turned on. When the address signal /A12 is low in level at this time, a match or coincidence signal is outputted as a low level. If the address signal /A12 is high in level, then a mismatch signal is outputted as a high level.

An operation for performing a comparison between each of other address signals A10 and /A10 and A11 and /A11 and information stored in each EPROM is also similar to the above compare operation. When all the bits of the three-bit address signals A10 through A12 match with the information, an OR gate circuit G1 produces a compare coincidence signal low in level and makes the operation of the output driver valid or effective. Namely, the output driver transfers signals on input/output lines I/O to an output terminal Dj in response to a low level of an output control signal WE./OE. If even one bit mismatches with the information and thereby a mismatch signal is produced, then the OR gate G1 forms an output signal high in level. Therefore, the output of an OR gate G2 constituting the output selection circuit remains at a high level regardless of the low level of the control signal WE./OE, whereby the output driver remains at an output high impedance. Although circuit symbols affixed to the gate circuits shown by way of illustration overlap with those shown in FIG. 8 to prevent the circuit diagram from becoming complex in the same drawing, they are used to implement separate circuit functions.

Figure 11:
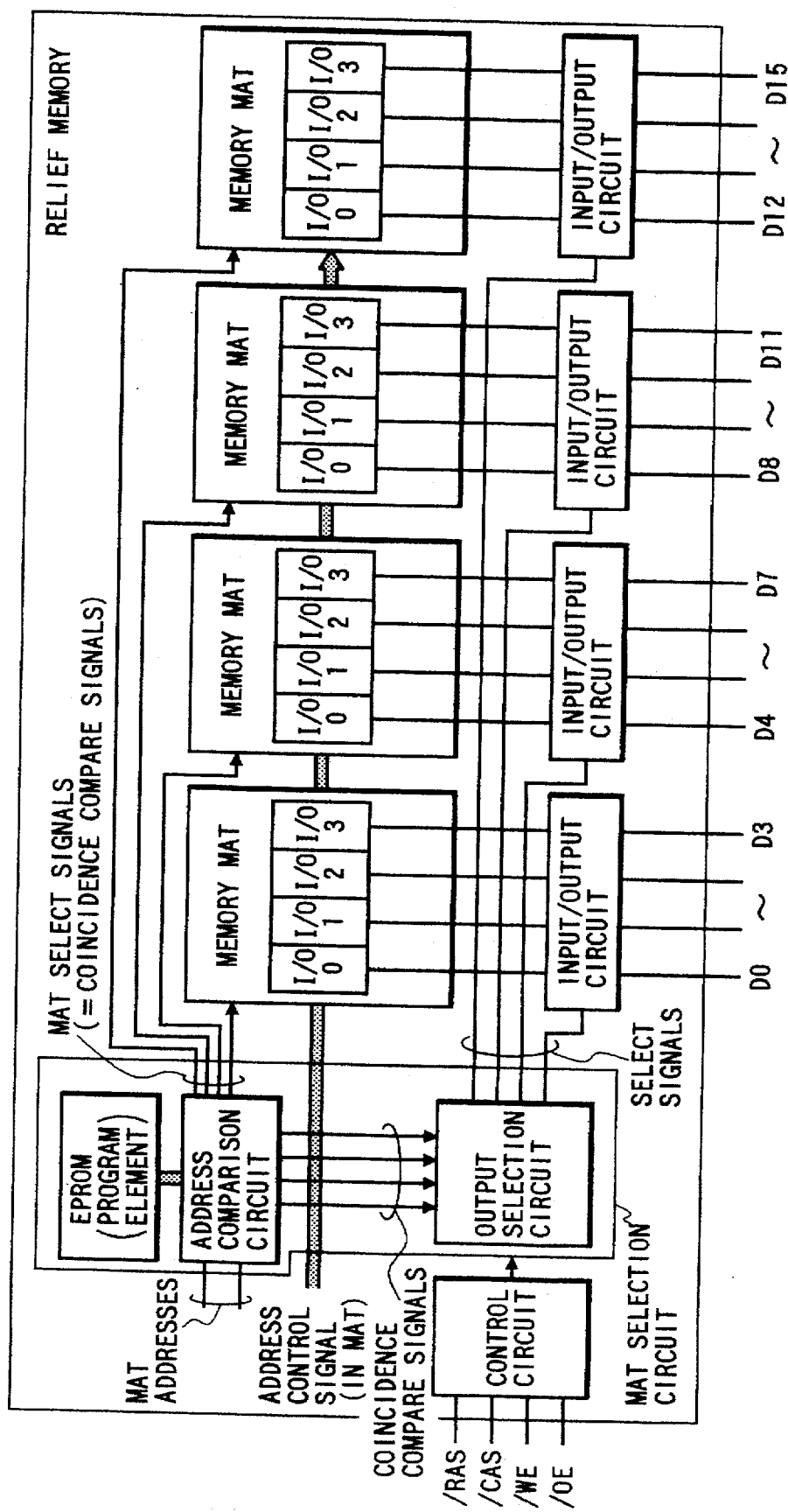
FIG. 11 is a schematic block diagram depicting a still further embodiment of a semiconductor memory device according to the present invention.

A schematic block diagram of a further embodiment of a semiconductor memory device according to the present invention is shown in FIG. 11. Respective circuit blocks shown in the same drawing are used to principally describe the relationship between the memory mats and input/output circuits IOB shown in FIG. 9. A mat selection circuit shown in the same drawing comprises an EPROM, an address comparison circuit and an output selection circuit such as those shown by the specific circuits in FIG. 10.

The address comparison circuit compares failure address information stored in the EPROM and a mat address corresponding to the failure address information and produces or forms a signal for selecting one of memory mats provided as spares. Each signal outputted from the address comparison circuit is also sent to the output selection circuit from which a select signal for making effective the operation of an input/output circuit associated with a memory mat to be replaced in place of the imperfect memory mat is formed. Although input buffers are not shown in the same drawing, address signals transferred to the individual memory mats are captured through the input buffers.

Each mat select signal is used to finally select one memory mat from the four memory mats. In the address multiplex system in which the X address signal and the Y address signal are input and the X address or the Y address is assigned to the corresponding memory mat as the address for the memory mat, as described above, when matching is obtained by the X address alone, a row-system address selecting operation is performed by its corresponding memory mat. If matching is obtained even by the Y address, then an input/output circuit is selected correspondingly and hence one memory mat is finally selected in place of the imperfect memory mat. If the Y address mismatches, then only the row-system address selecting operation is performed and hence a refresh operation is effected on such a memory mat.

Figure 12A:
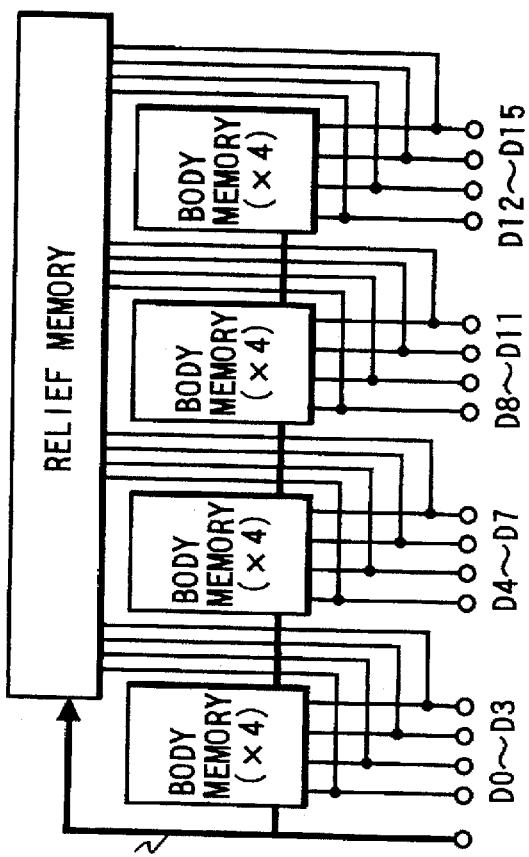
FIGS. 12A and 12B are block diagrams showing one embodiment of a memory module according to the present invention.
Figure 12B:
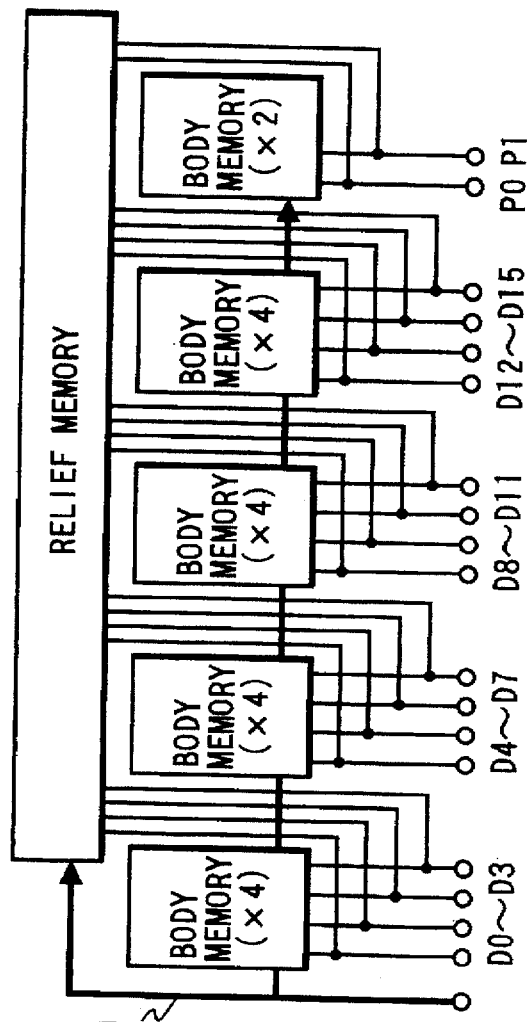

Block diagrams of one embodiment of a memory module according to the present invention are shown in FIGS. 12A and 12B. FIG. 12A indicates a memory module in which memory accesses are made in units of 16 bits. In FIG. 12A, semiconductor memory devices each equivalent to that shown in FIG. 1 and in which memory accesses are made in units of 4 bits, are provided as body memories so as to be parallel-connected to one another as four in total. Thus, the memory accesses are performed in units of 16 bits as a whole. Other semiconductor memory device shown in FIG. 9 defined as one relief memory is combined with the four body memories.

FIG. 12B indicates a memory module in which memory accesses are performed in units of 18 bits in total, which comprise data of 16 bits and parity bits P0 and P1 corresponding to two bits. Therefore, semiconductor memory devices each equivalent to that shown in FIG. 1 and in which memory accesses are made in units of 4 bits, are provided as body memories so as to be parallel-connected to one another as five in total. Thus, the memory accesses are performed in units of 18 bits as a whole. A half storage area corresponding to the remaining two bits in the body memory in which the parity bits are stored, is not used. Other semiconductor memory device shown in FIG. 9 defined as one relief memory is combined with the five body memories. Here, memory mats, which are five in total, are respectively used so as to correspond to the five body memories. However, two of I/O bits whose parts are nondefective articles (e.g., two bits of four bits are nondefective articles) or two DRAMs (each of which is ×1 bit type) which are a generation before, may be mounted.

Although no particular restrictions are imposed on the body memories, faulty or imperfect memory mats are respectively selected to the body memories one by one. Further, the body memories are provided on a mounted substrate such as a printed board or the like constituting a memory module. A fuse is blown out in correspondence with each of the defective memory mats provided within the body memories one by one to thereby prohibit a substantial access from being made to each faulty memory mat and prevent a dc current from steadily flowing into the faulty memory mat due to the cutoff of the above power circuit and the output high impedance of the input buffer or the like. In the relief memory, faulty addresses for the faulty memory mats are stored in an EPROM thereof.

Data terminals of each of the body memories are parallel-connected to data terminals of each memory mat, which are associated with those of the relief memory on the mounted substrate. Thus, when an access to the imperfect memory mat in each body memory is made, the memory mat provided in the relief memory is accessed so that the input and output of data are performed through the data terminals commonly provided on the mounted substrate.

As in the present embodiment in which each body memory to be relieved in a memory block unit is replaced by the memory mat provided in another relief memory, the relief memory mat large in circuit scale is not formed in each body memory. It is therefore possible to reduce an area occupied by each body memory and increase the number of memory chips formable from a single semiconductor wafer. Memory mats in which failures occur in units of word lines or bit lines, are relieved by built-in redundant circuits and can be brought into the commercial stage as nondefective ones.

The memory mats that cannot be relieved by the built-in redundant circuits when the number of defective word lines or bit lines is greater than the number of spare word lines or bit lines or due to the occurrence of a dc failure, are regarded as being imperfect ones in units of memory mats without being abandoned as in the conventional example and the fuse is blown out in this condition. When they are used as the memory module, they are combined with an additionally-prepared relief memory so as to be substantially commercially available. Thus, product yields can be substantially enhanced as a whole.

Figure 13:
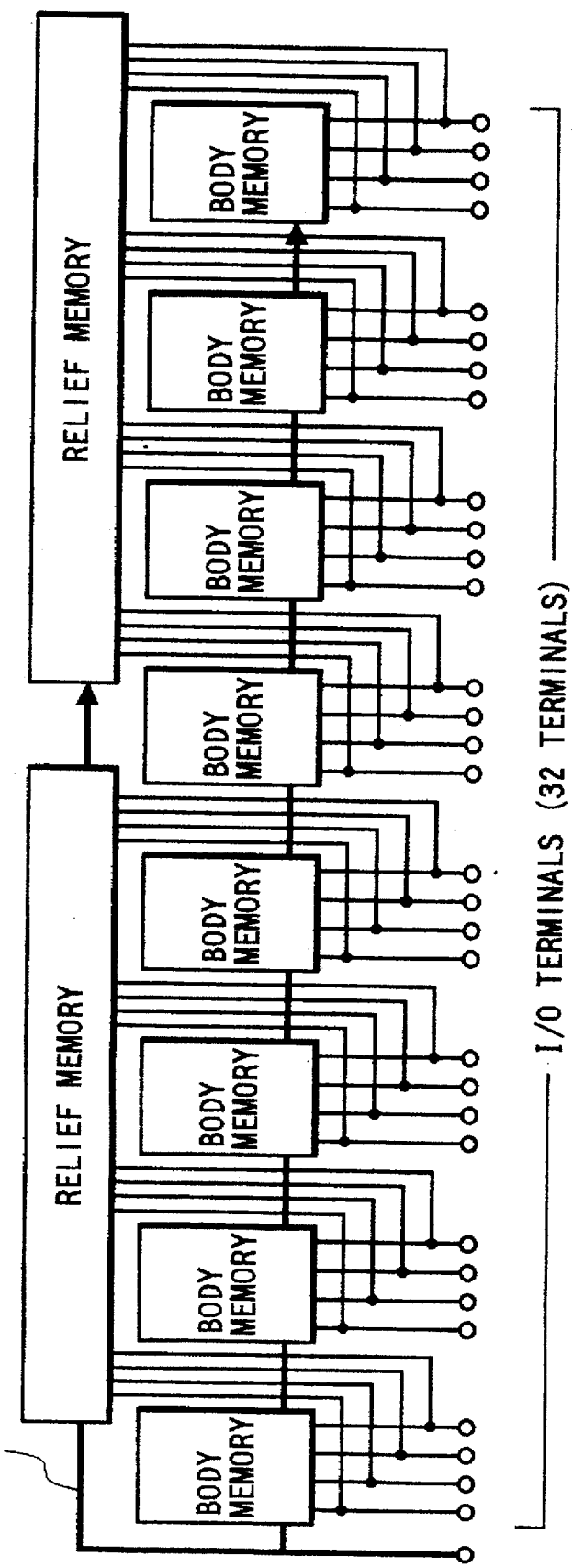
FIG. 13 is a block diagram illustrating another embodiment of a memory module according to the present invention.

A block diagram of another embodiment of a memory module according to the present invention is shown in FIG. 13. The present embodiment is intended for the use of a memory module in which memory accesses are made in units of 32 bits. Therefore, semiconductor memory devices each equivalent to that shown in FIG. 1 and in which memory accesses are made in units of 4 bits, are provided as body memories so as to be parallel-connected to one another as eight in total. Thus, the memory accesses are performed in units of 32 bits as a whole. Other semiconductor memory devices each shown in FIG. 9 defined as two relief memories are combined with the eight body memories. The relief of the defective memory mats in the body memories is similar to that made in the embodiment shown in FIGS. 12A and 12B and its description will therefore be omitted.

Each of the body memories mounted on the memory module does not necessarily need to have one faulty memory mat. Namely, the imperfect memory mat may exist in each body memory so as to fall within the range of the number of memory mats provided in each relief memory. Even when two faulty memory mats exist in each body memory in FIG. 12A, for example, they can be relieved. At this time, input/output terminals associated with the two memory mats in the relief memory are parallel-connected to input/output terminals D0 through D3 for each body memory, which are similar to the input/output terminals. A non-defective chip with no defective memory mats is used for at least one body memory of the remaining three body memories.

In each body memory, each memory mat assigned to the same address may be regarded as faulty. Upon such addressing in this case, all the body memories are substantially brought into a non-operating state and alternatively all the memory mats in the relief memory are simultaneously selected so that the writing and reading of data D0 through D15 or the like are performed.

In doing so, however, a load imposed on a specific address as seen from a bus driver increases in the memory module of the present embodiment, thereby causing variations in memory access. It is therefore desirable that the addresses assigned to the faulty memory mats in the body memories are distributed within the memory module.

Figure 14:
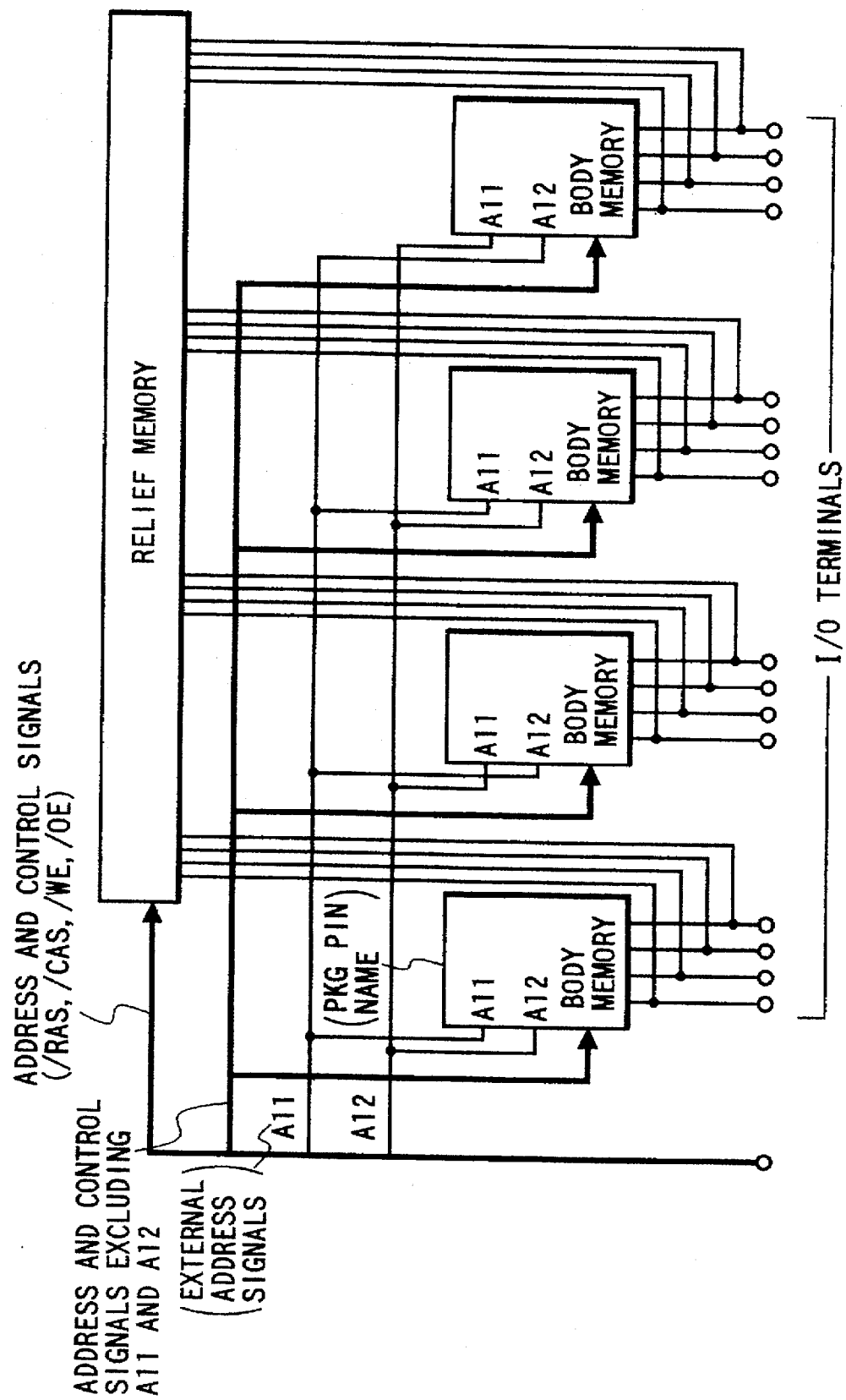
FIG. 14 is a block diagram depicting a further embodiment of a memory module according to the present invention.

A block diagram of a further embodiment of a memory module according to the present invention is shown in FIG. 14. The present embodiment is intended for the use of a memory module in which memory accesses are effected in units of 16 bits in the same manner as in FIG. 12A. Since a semiconductor integrated circuit device is mass-produced using a photographic printing technique, there is a high possibility that a failure is physically developed in the same position as in the case where flaws are made in a mask pattern. In this case, a body memory, which needs to relieve each faulty memory mat assigned to the same address, is manufactured in large numbers.

In the present embodiment, the body memories each having the faulty memory mat assigned to the same address physically as described above are used. A change in address is equivalently performed in order to avoid inconvenience that the load or burden imposed on the specific address as seen from the bus driver is increased. Namely, the address signals A12 and A11 inputted to the body memory are reversely inputted between two body memories. Owing to the changing of the addresses, another memory mat is logically selected according to the relationship that addresses inputted from the outside are reversely supplied even when a failure occurs in a memory mat assigned to the same address physically in the same body memory, whereby the addresses can be relatively changed to separate addresses when the memory mat is regarded as the memory module.

Figure 15:
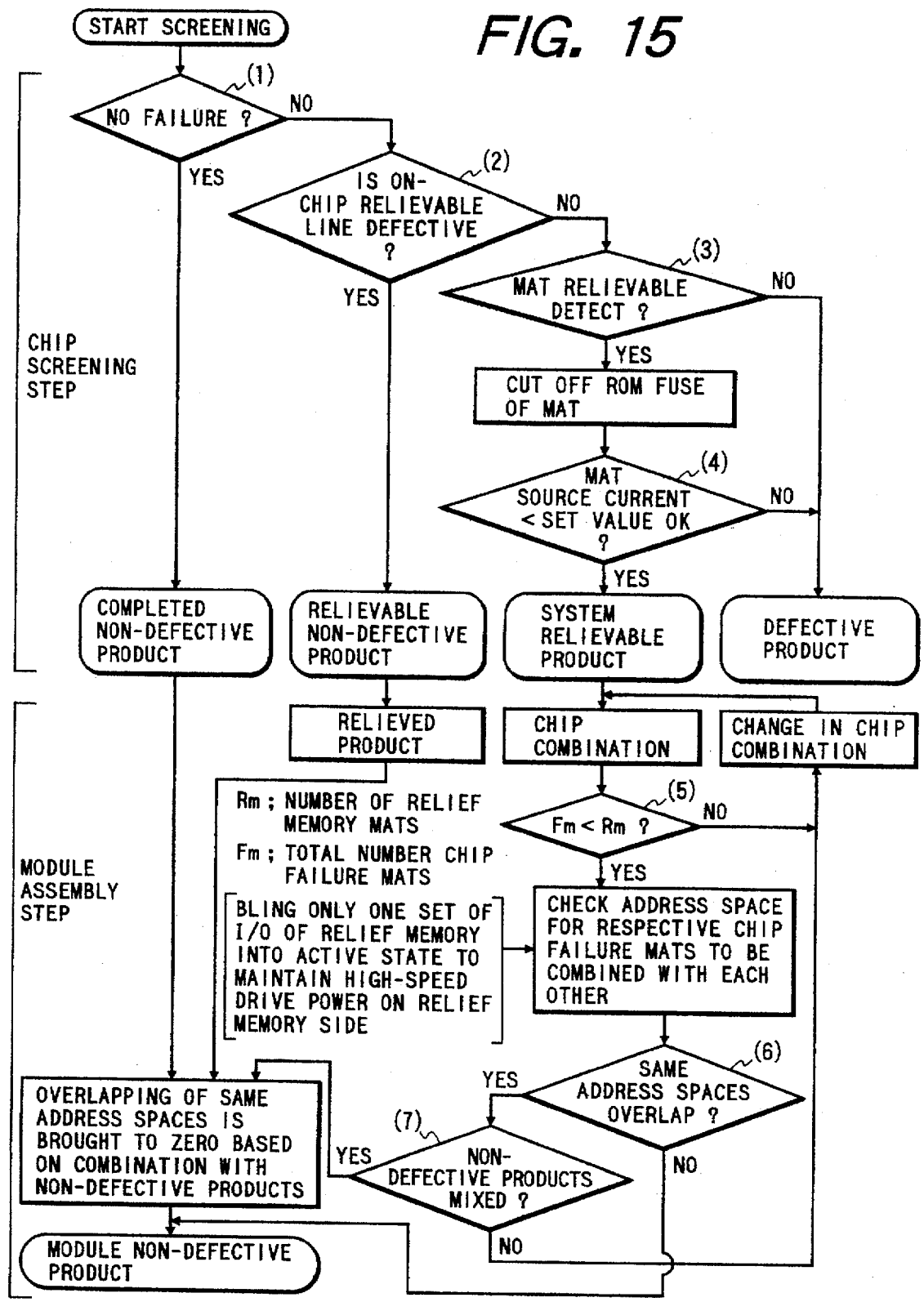
FIG. 15 is a flowchart for describing a method of assembling a memory module according to the present invention.

A flowchart for describing a method of assembling a memory module according to the present invention is shown in FIG. 15. In a chip selection process, it is determined or judged in Step (1) whether a failure occurs. If the answer is YES in Step (1), then a defect-free one is shipmented as a completed non-defective product. If it is judged in Step (2) that of those having failures or defects, one is regarded as having a failure on-chip relievable in units of word lines or bit lines, it is then shipmented as an on-chip relievable non-defective product. The process until now is identical to a chip selection process for a dynamic RAM having an on-chip relievable function.

The function of performing separation between the memory mats in units of the memory mats is provided in the present embodiment. Therefore, if it is judged in step (3) that a mat relievable failure has occurred, then a ROM fuse associated with a memory mat regarded as faulty is blown out. It is judged in Step (4) based on the electrical separation of the faulty memory mat from others whether a dc current (leak current) falls within the allowable value. Thereafter, the memory mat is transferred to the following module assembling process as a non-defective product relievable on a system.

In the memory module assembling process, a check is performed on the relationship between the number Fm of the relievable memory mats and the number Rm of faulty memory mats in each body memory. If Fm<Rm, then a body memory is combined with a relief memory. At this time, as the body memory to be combined therewith, is selected one wherein only one set of I/O in the relief memory is brought into an active state to avoid overlapping of addresses in the corresponding faulty memory mat with each other, i.e., to maintain high-speed driving power on the relief memory side. The selected one is regarded as a memory module. At this time, a method of performing a changing between addresses in the body memory and using the same in the above-described manner is also adopted. When the same address spaces overlap each other in Step (6), the overlapping of the same address spaces is brought into zero from the combination with non-defective chips, whereby the resultant one is regarded as a module non-defective product. If the mix of the non-defective products cannot be made, then a chip combination is changed.

Figure 16:
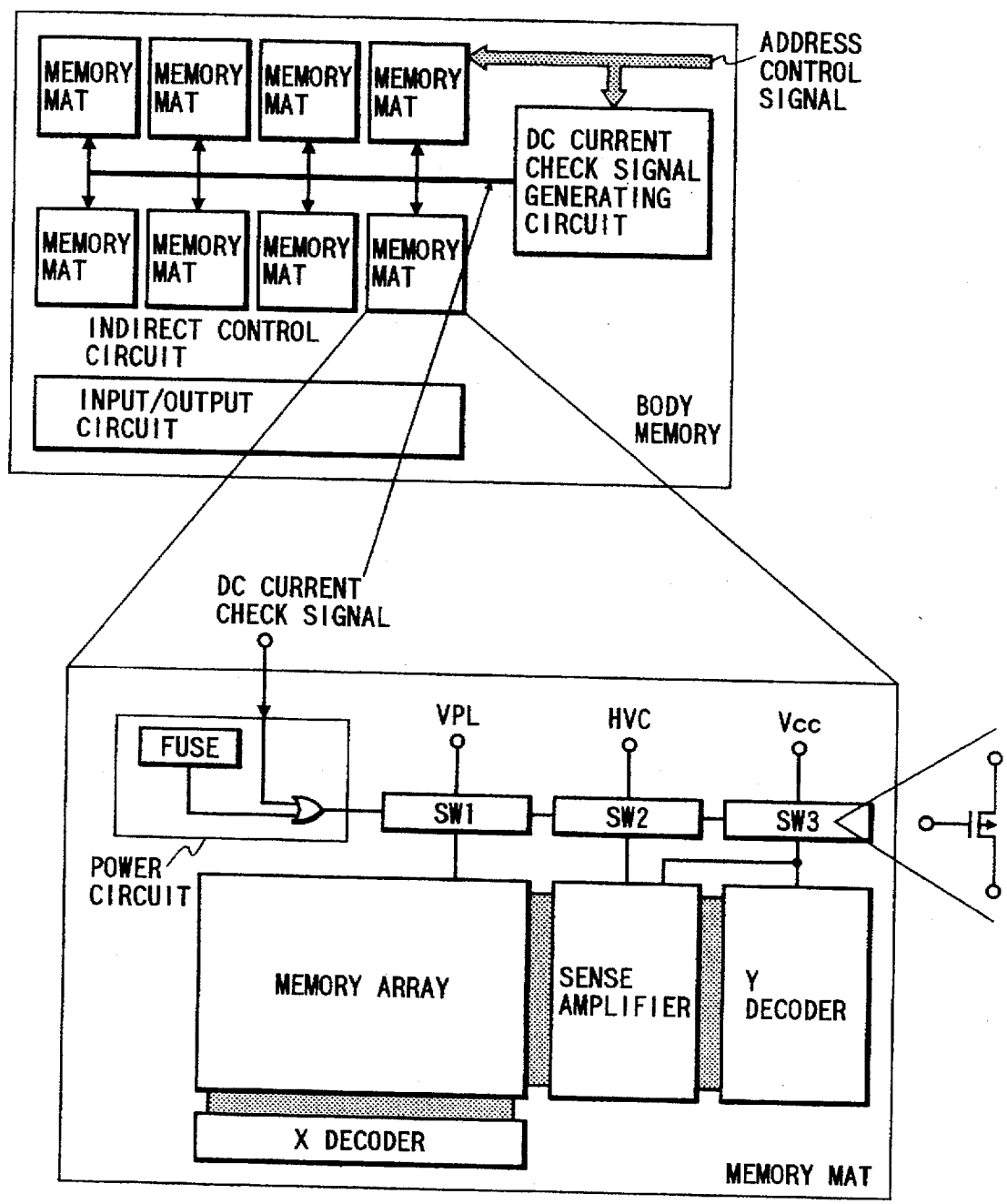
FIG. 16 is a block diagram showing a still further embodiment of a semiconductor memory device according to the present invention.

A block diagram of a still further embodiment of a semiconductor memory device according to the present invention is shown in FIG. 16. The function of checking the DC current using the function of electrically separating the faulty memory mat from others is also additionally provided in the present embodiment. Namely, the function is also used for supplying an electric signal equivalent to the blowing of the fuse Fuse for electrically separating the above faulty memory mat and thereby cutting off the dc current in each memory mat unit. Therefore, a signal line for supplying a DC current check signal is provided on the memory mat side. The signal supplied through the signal line forms the above malfunction signal MF based on a signal from the fuse Fuse and a logical OR signal to thereby control switches SW1, SW2 and SW3 and the like.

In the above test function, the DC current check signal may be supplied from a probe upon probing. However, if done in this way, then the function is merely available for a test on a semiconductor wafer. Thus, a DC current check signal generating circuit is provided in the present embodiment. When a dc current exceeding the allowable value is detected, a test mode is set based on an address signal and a control signal and a DC current check signal is supplied in units of memory mats, thereby detecting the dc current flowing in a semiconductor memory at that time. If the dc current remains exceeded the allowable value, it is then understood that a dc failure or defect does not exist in the corresponding memory mat and the cause that the dc current flows in other memory mats exists.

When a memory mat in which the dc failure exists, is designated, the plate voltage VPL, the half precharge voltage HVC and the source voltage Vcc or the like are cut off and each input buffer is brought into the output high impedance as described above in the present memory mat. Thus, since a dc current path is forcedly cut off regardless of the presence of the dc failure and the dc current in the semiconductor memory becomes the allowable value or less, the dc failure is found to exist in the memory mat. In the present embodiment, the dc failure in the memory mat units can be simply found out by simply performing the above test eight times when the memory mat is divided into eight as described above. When the dc current does not reach the allowable value or less as a result of the above eight tests, a defect such as a dc failure is found to exist in an indirect control circuit such as an input/output circuit or the like and such a defect is judged as an unrelievable one.

A schematic configuration view of a still further embodiment of a memory module according to the present invention is shown in FIG. 17. In the memory module according to the present embodiment, body memories and a relief memory are placed on the surface of a mounted substrate such as a printed board or the like. Namely, when the memory module shown in FIG. 12A or FIG. 14 is configured, the body memories are mounted thereon so as to be divided by two from side to side with the relief memory as the center. Each I/O line group for the relief memory is electrically connected to a terminal group connected to input/output terminals of each body memory by printed wiring or the like. In the same drawing, four sets of I/O terminal groups for the relief memory are respectively indicated by a single line. As shown in the block diagrams of FIG. 12A and FIG. 14, the respective I/O terminal groups for the relief memory are respectively connected so as to correspond to four input/output terminals for the body memories.

Figure 18A:
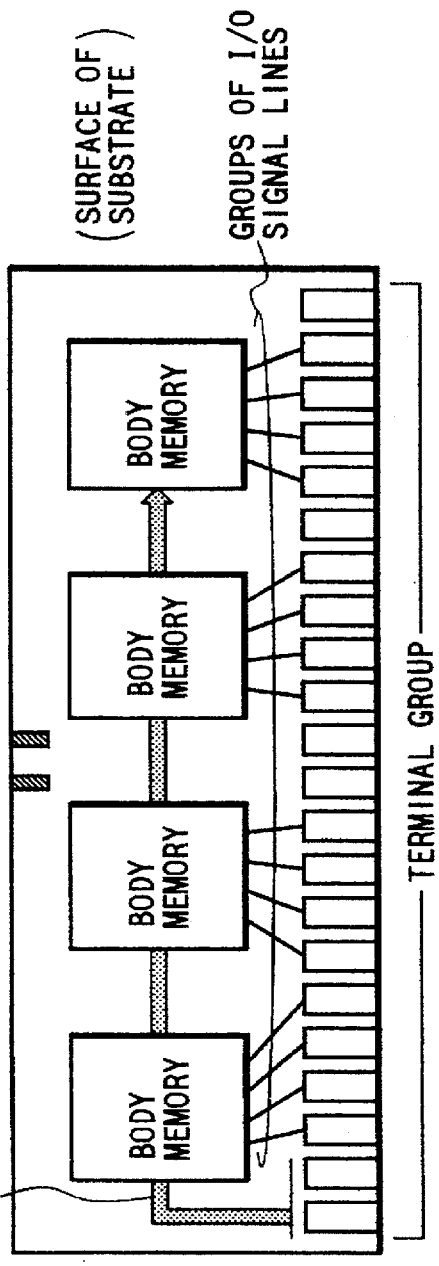
FIG. 18 is a schematic configurational view showing a still further embodiment of a memory module according to the present invention.
Figure 18B:
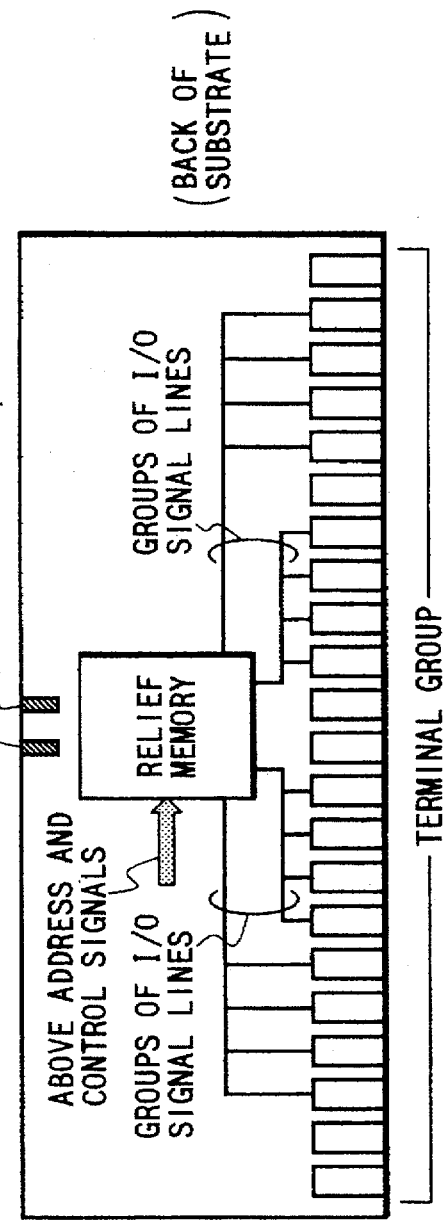

A schematic configurational view of a still further embodiment of a memory module according to the present invention is shown in FIG. 18. In the memory module according to the present embodiment, both surfaces of a mounted substrate such as a printed board or the like are used. Namely, four body memories are mounted on the surface of the substrate shown in FIG. 18(A). A single relief memory is mounted on the back of the substrate shown in FIG. 18(B). In the same manner as described above, each I/O line group for the relief memory is electrically connected to a terminal group connected to input/output terminals of each body memory by printed wiring provided on the reverse side. Since a memory module relieved by the relief memory and a memory module composed of non-defective products can be placed on the mounted substrate whose surfaces are identical in size, a single memory device can be formed by mixing the memory module including the relief memory and the memory module composed of the non-defective products.

EPROM write terminals for high-voltage application and control signals are provided on the mounted substrate on the opposite side of the terminal group. Thus, when a dc failure of a memory mat and a word-line or bit-line failure unrelievable by a built-in redundant circuit occur on the body memory side after assembly of the memory module, they can be relieved by the relief memory when a non-used memory mat exists in the relief memory. Since, however, the input/output terminals associated with each memory mat provided in the relief memory are respectively connected to the input/output terminals of each body memory in the memory module, the corresponding relief is limited to the case where the failure occurs in each body memory placed under the above connection relation.

Figure 19:
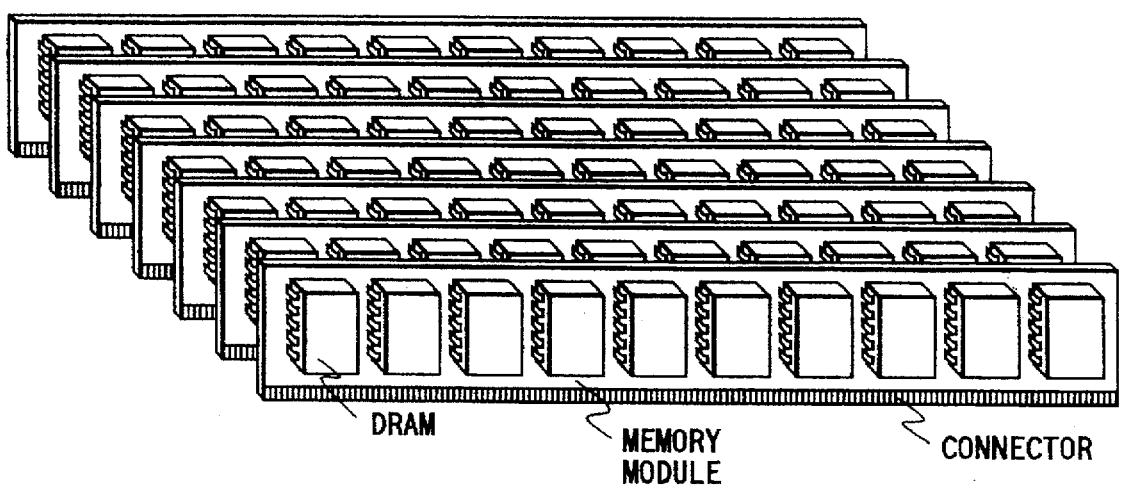
FIG. 19 is a fragmentary schematic view of a memory board showing a memory storage unit employed in a computer system to which DRAMs according to the present invention are applied.

A fragmentary schematic view of a memory board showing a memory storage unit employed in a computer system to which DRAMs (dynamic RAMs) according to the present invention are applied, is shown in FIG. 19. The present memory board is of a memory board which comprises a plurality of memory modules according to the present invention. A plurality of packaged body memories and relief memories according to the present invention are mounted on each memory module. The body memories and the relief memories are electrically connected to one another by wires or conductors on each memory module. The body memories and the relief memories are connected to address buses or data buses in the computer system by connectors on each memory module. Their connection is performed by inserting the connectors into their corresponding slots for the memory board, of memory sections in the memory storage unit provided within the computer system. Thus, the capacity of storage of information into a storage device in the computer system or the like is determined according to the number of the body memories mountable on the memory board or each memory module.

The body memories according to the present embodiment are not limited to the case where they are used in combination with the relief memories when imperfect memory mats exist therein. Namely, other memory mats can be effectively utilized in theory in a state in which only faulty memory mats have been electrically separated from others. However, if done in this way, then no storage areas exist at specific addresses of addresses assigned to the semiconductor memory, thereby impairing operability.

It is therefore convenient to utilize each memory as a partial product as in the case where a half storage area including the faulty memory mats is used as invalid. Namely, when a dc failure occurs and the number of defective word lines or bit lines is greater than the number of spare word lines or bit lines, a half storage area having addresses continuous upon usage may be utilized by simply blowing a fuse corresponding to a memory mat associated therewith.

The relief memories according to the present embodiment are not limited to the case where they are used in combination with the body memories. Namely, each of the relief memories can be utilized as a separate semiconductor memory. Since the semiconductor memory according to the present embodiment is equipped with the EPROM, desired addresses can be assigned onto the system. Namely, a desired address can be assigned by combining an address assigned to a memory array of each memory mat and an address for specifying the corresponding memory mat. In a small microcomputer system such as an electronic notebook or the like, other memories such as ROM, etc. and input/output devices are assigned to a relatively small address space. Therefore, a desired address, which does not overlap with each address in the ROM or the like, can be assigned and used by simply writing data into the EPROM provided in each semiconductor memory upon above assignment.

Thus, the diversity of the body memories and the relief memories according to the invention of the present application can be brought about as in the case where they are used as the partial products as described above and they can be utilized as address-assignable memories as well as the case where product yields are substantially enhanced as is in the case in which the body memories and the relief memories are utilized in combination to form each memory module. Further, each relief memory eliminates the need for the development of a special product. Namely, the memory module can be formed by simply moving or transporting the memory mats and the input/output interfaces in each body memory as they are. Further, the remaining storage circuits such as an EPROM, etc. and address comparison circuit and the like may be designed anew. In this case, however, a large burden is not produced because a circuit scale is small.

Operations and effects, which can be brought about from the above embodiments, are as follows:

(1) A circuit configuration is adopted which includes a plurality of memory mats each constructed such that an internal address signal or a predecode signal and a control signal are supplied through a first input buffer circuit, the address signal or the predecode signal is decoded by an address selection circuit to thereby select a memory cell in one or plural units from each memory array in which memory cells are provided in matrix form at points where a plurality of word lines and a plurality of bit lines intersect, and a second input buffer for receiving a signal to be written into the memory cell, an output buffer for outputting a signal read from the memory cell and storing means in which malfunction information is written, are provided to thereby substantially cut off the supply of power to a sense amplifier and its corresponding memory cell based on the malfunction signal stored in the storing means. Thus, an effect can be brought about that when a dc failure occurs in the corresponding memory mat, such a memory mat can be electrically separated from others and used as a semiconductor memory device which makes the most of the remaining portions.

(2) An effect can be brought about that a plurality of memory mats each constructed such that an internal address signal or a predecode signal and a control signal are supplied through a first input buffer circuit, the address signal or the predecode signal is decoded by an address selection circuit to thereby select a memory cell in one or plural units from each memory array in which memory cells are provided in matrix form at points where a plurality of word lines and a plurality of bit lines intersect and each comprising a second input buffer for receiving a signal to be written into the memory cell and an output buffer for outputting a signal read from the memory cell; storage circuits provided so as to correspond to the memory mats and in which address information are written; and a plurality of sets of input/output terminals at which the address information is compared with an address signal for designating each memory mat to detect that a memory mat associated with the address information has been selected, thereby validating the operation of the second input buffer or the output buffer of the corresponding memory mat and which are associated with the memory mats, are provided, thereby making it possible to obtain a semiconductor memory device in which a desired address is assigned to the corresponding storage circuit and to utilize it as a redundant semiconductor memory device, which relieves failures in units of memory mats, as needed.

(3) An effect can be brought about that a first semiconductor memory device having a plurality of memory mats each constructed such that an internal address signal or a predecode signal and a control signal are supplied through a first input buffer circuit, the address signal or the predecode signal is decoded by an address selection circuit to thereby select a memory cell in one or plural units from each memory array in which memory cells are provided in matrix form at points where a plurality of word lines and a plurality of bit lines intersect, and a second input buffer for receiving a signal to be written into the memory cell, an output buffer for outputting a signal read from the memory cell and storing means in which malfunction information is written, are provided to thereby substantially cut off the supply of power to a sense amplifier and its corresponding memory cell based on the malfunction signal stored in the storing means; and a second semiconductor memory device having a plurality of memory mats identical in configuration to the above memory mats, storage circuits provided so as to correspond to the plurality of memory mats and in which address information are written, and a plurality of sets of input/output terminals at which the address information is compared with an address signal for designating each memory mat to detect that a memory mat associated with the address information has been selected, thereby validating the operation of the second input buffer or the output buffer of the corresponding memory mat and which are associated with the memory mats, are both placed on a single mounted substrate, and a defective or faulty memory mat is electrically separated from others in the first semiconductor memory device, address information associated with the faulty memory mat is written into its corresponding storage circuit in the second semiconductor memory device and external data terminals associated with the faulty memory mat and the above input/output terminals associated with the memory mat in the second semiconductor memory device are connected to one another on the mounted substrate so as to correspond to one another, whereby the second semiconductor memory device can be relieved on the mounted substrate in combination with the first semiconductor memory device while using the first semiconductor memory device in which failures exist in memory mat units, thereby making it possible to enhance substantial yields of semiconductor memory devices.

(4) An effect can be brought about that failures in units of the word lines or bit lines can be relieved by a small circuit scale by providing redundant circuits for saving or relieving the failures in units of the word lines or bit lines within the memory array and the address selection circuit and substantial product yields can be enhanced by combining the present relief with the relief of the failures in the memory mat units.

(5) Each storing means referred to above is provided with an input electrode for inputting the same electric signal as when malfunction information is equivalently written and the input electrode is supplied with the electric signal based on probing or a control signal supplied from each external terminal, thereby making it possible to bring about an effect that the function of efficiently detecting dc failures in memory mat units can be added.

(6) In the first semiconductor memory device, two semiconductor memory devices having failures at memory mats provided at the same position physically exist and address signals for designating memory mats are inputted from address terminals different from one another to thereby regard equivalently-different memory mats as faulty as seen from a second semiconductor memory device, whereby an effect can be brought about that burdens as seen from the bus driver side can be distributed so as to prevent a memory operation from becoming delayed.

Thus, the invention made by the present inventors, has been described specifically by the embodiments. However, the invention of the present application is not necessarily limited to the above embodiments. It is needless to say that many changes can be made without departing from the scope or gist of the invention. In a dynamic RAM, for example, address signals or X and Y addresses may be supplied from address terminals independent of each other. Since a memory mat to be selected can be judged from an address input in this case, only the specified memory mat can be activated even when the Y address is assigned to its corresponding address for the memory mat. In a relief memory, the above EPROM, an EPROM constructed on the precondition that re-writing is performed, or a fuse may be used as a storage circuit for storing each address of the memory mat. In this case, the fuse may be one melted by allowing current to flow therethrough as well as blown by a laser beam. Since the stored information is relatively small as is in the case of 16 bits or the like as described above, an increase in occupied area presents no problem as compared with the case where the EPROM is mounted, thereby eliminating the need for addition of a manufacturing process.

Layouts of a memory array, a sense amplifier and a decoder in each memory mat and layouts of memory mats on a semiconductor chip can take various modes or forms. The present invention can be widely applied to various semiconductor memory devices such as the above dynamic RAM, a static RAM, an EPROM or a flash EPROM, etc.

Advantageous effects obtained by typical ones of the invention disclosed in the present application will be briefly described as follows: Namely, a circuit configuration is adopted which includes a plurality of memory mats each constructed such that an internal address signal or a predecode signal and a control signal are supplied through a first input buffer circuit, the address signal or the predecode signal is decoded by an address selection circuit to thereby select a memory cell in one or plural units from each memory array in which memory cells are provided in matrix form at points where a plurality of word lines and a plurality of bit lines intersect, and a second input buffer for receiving a signal to be written into the memory cell, an output buffer for outputting a signal read from the memory cell and storing means in which malfunction information is written, are provided to thereby substantially cut off the supply of power to a sense amplifier and its corresponding memory cell based on the malfunction signal stored in the storing means. Thus, when a dc failure occurs in the corresponding memory mat, such a memory mat can be electrically separated from others and used as a semiconductor memory device which makes the best use of the remaining portions.

A plurality of memory mats each constructed such that an internal address signal or a predecode signal and a control signal are supplied through a first input buffer circuit, the address signal or the predecode signal is decoded by an address selection circuit to thereby select a memory cell in one or plural units from each memory array in which memory cells are provided in matrix form at points where a plurality of word lines and a plurality of bit lines intersect and each comprising a second input buffer for receiving a signal to be written into the memory cell and an output buffer for outputting a signal read from the memory cell; storage circuits provided so as to correspond to the memory mats and in which address information are written; and a plurality of sets of input/output terminals at which the address information is compared with an address signal for designating each memory mat to detect that a memory mat associated with the address information has been selected, thereby validating the operation of the second input buffer or the output buffer of the corresponding memory mat and which are associated with the memory mats, are provided, thereby making it possible to obtain a semiconductor memory device in which a desired address is assigned to the corresponding storage circuit and to utilize it as a redundant semiconductor memory device, which performs the relief of failures in units of memory mats, as needed.

A first semiconductor memory device having a plurality of memory mats each constructed such that an internal address signal or a predecode signal and a control signal are supplied through a first input buffer circuit, the address signal or the predecode signal is decoded by an address selection circuit to thereby select a memory cell in one or plural units from each memory array in which memory cells are provided in matrix form at points where a plurality of word lines and a plurality of bit lines intersect, and a second input buffer for receiving a signal to be written into the memory cell, an output buffer for outputting a signal read from the memory cell and storing means in which malfunction information is written, are provided to thereby substantially cut off the supply of power to a sense amplifier and its corresponding memory cell based on the malfunction signal stored in the storing means; and a second semiconductor memory device having a plurality of memory mats identical in configuration to the above memory mats, storage circuits provided so as to correspond to the plurality of memory mats and in which address information are written, and a plurality of sets of input/output terminals at which the address information is compared with an address signal for designating each memory mat to detect that a memory mat associated with the address information has been selected, thereby validating the operation of the second input buffer or the output buffer of the corresponding memory mat and which are associated with the memory mats, are both placed on a single mounted substrate. Further, a defective or faulty memory mat is electrically separated from others in the first semiconductor memory device. In the second semiconductor memory device, address information associated with the faulty memory mat is written into its corresponding storage circuit and external data terminals associated with the faulty memory mat and the above input/output terminals associated with the memory mat in the second semiconductor memory device are connected to one another on the mounted substrate so as to correspond to one another. Thus, the second semiconductor memory device can be relieved on the mounted substrate in combination with the first semiconductor memory device while using the first semiconductor memory device in which failures exist in memory mat units, thereby making it possible to enhance substantial yields of semiconductor memory devices.

Failures or defects in units of the word lines or bit lines can be relieved with a small circuit scale by providing redundant circuits for saving or relieving the failures in units of the word lines or bit lines within the memory array and the address selection circuit. Substantial product yields can be enhanced by combining the present relief with the relief of the failures in the memory mat units.

Each storing means referred to above is provided with an input electrode for inputting the same electric signal as when malfunction information is equivalently written and the input electrode is supplied with the electric signal based on probing or a control signal supplied from each external terminal, whereby the function of efficiently detecting dc failures in memory mat units can be added.

In the first semiconductor memory device, two semiconductor memory devices having failures at memory mats provided at the same position physically exist and address signals for designating memory mats are inputted from address terminals different from one another to thereby regard equivalently-different memory mats as faulty as seen from a second semiconductor memory device, whereby burdens as seen from the bus driver side can be distributed so as to prevent a memory operation from becoming delayed.

What is claimed is:

1. A semiconductor memory device comprising:

a first input buffer for receiving an address signal therein;

an address selection circuit for selecting a memory cell based on the address signal input through said first input buffer;

a second input buffer for receiving therein a signal to be written into the memory cell;

an output buffer for outputting a signal read from the memory cell;

a sense amplifier connected to the memory cell so as to obtain the read signal;

a storing circuit for storing malfunction information; and a power cut-off circuit for interrupting an operating voltage to said sense amplifier in response to the malfunction signal stored in said storing means;

wherein outputs produced from said first and second input buffers and said output buffer are brought into high impedance based on the malfunction information.

2. A semiconductor memory device according to claim 1, further comprising:

a redundant circuit for relieving failures in units of word lines and bit lines to which the memory cell is connected.

3. A semiconductor memory device according to claim 2, wherein said storing circuit includes an input electrode for inputting an electric signal corresponding to the malfunction information, said input electrode being supplied with the electric signal formed based on a signal supplied from an external terminal.

4. A memory module having a plurality of semiconductor memory devices, comprising:

a plurality of memory mats included in first semiconductor memory devices of said plurality of semiconductor memory devices respectively, said each memory mat comprising:

a first input buffer for receiving an address signal therein;

an address selection circuit for selecting a memory cell based on the address signal input through said first input buffer;

a second input buffer for receiving therein a signal to be written into the memory cell;

an output buffer for outputting a signal read from the memory cell;

a sense amplifier connected to the memory cell so as to obtain the read signal;

a storing circuit for malfunction information; and a power cut-off circuit for interrupting an operating voltage to said sense amplifier in response to the malfunction signal stored in said storing means;

wherein outputs produced from said first and second input buffers and said output buffer are brought into high impedance based on the malfunction formation; and second semiconductor memory devices of said plurality of semiconductor memory devices including redundant memory mats for respectively relieving defective memory mats in said first semiconductor memory devices.

5. A memory module according to claim 4, wherein external data terminals corresponding to the defective memory mats in said first semiconductor memory device and external data terminals corresponding to said redundant memory mats in said second semiconductor memory device are connected to one another on a mounted substrate so as to correspond to one another.

* * * * *